US 9,127,358 B2

(12) United States Patent
Inoue et al.

(10) Patent No.: US 9,127,358 B2
(45) Date of Patent: Sep. 8, 2015

(54) FILM FORMING APPARATUS

(75) Inventors: Mitsuya Inoue, Nirasaki (JP); Yasunori Kumagai, Nirasaki (JP); Kippei Sugita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 707 days.

(21) Appl. No.: 13/347,110

(22) Filed: Jan. 10, 2012

(65) Prior Publication Data
US 2012/0180719 A1 Jul. 19, 2012

(30) Foreign Application Priority Data

Jan. 14, 2011 (JP) ................................. 2011-006057

(51) Int. Cl.
| H01L 21/306 | (2006.01) |
| C23F 1/00 | (2006.01) |
| C23C 16/448 | (2006.01) |
| C23C 14/54 | (2006.01) |
| C23C 16/455 | (2006.01) |
| C23C 16/52 | (2006.01) |
| H01L 21/02 | (2006.01) |
| B05D 1/00 | (2006.01) |

(52) U.S. Cl.
CPC ........... *C23C 16/4481* (2013.01); *C23C 14/542* (2013.01); *C23C 14/543* (2013.01); *C23C 16/45561* (2013.01); *C23C 16/52* (2013.01); *H01L 21/02118* (2013.01); *H01L 21/02263* (2013.01); *B05D 1/60* (2013.01)

(58) Field of Classification Search
CPC C23C 14/542; C23C 14/543; C23C 16/4481; C23C 14/45561; C23C 16/52
USPC .................. 118/726, 723 VE; 156/345.29
See application file for complete search history.

(56) References Cited

U.S. PATENT DOCUMENTS

| 4,717,596 A * | 1/1988 | Barbee et al. .............. 427/248.1 |
| 6,258,171 B1 * | 7/2001 | Agarwal ........................ 118/715 |
| 6,663,716 B2 * | 12/2003 | Loan et al. ..................... 118/726 |
| 7,011,710 B2 * | 3/2006 | Bang et al. ..................... 118/715 |
| 2003/0101938 A1 * | 6/2003 | Ronsse et al. ................. 118/726 |
| 2007/0292612 A1 * | 12/2007 | Ueno et al. ................. 427/248.1 |

(Continued)

FOREIGN PATENT DOCUMENTS

| JP | 2000-122725 A | 4/2000 |
| JP | 2002-511529 A | 4/2002 |

(Continued)

*Primary Examiner* — Rudy Zervigon
(74) *Attorney, Agent, or Firm* — Nath, Goldberg & Meyer; Jerald L. Meyer

(57) ABSTRACT

A film forming apparatus for forming a polyimide film on a substrate installed within a film forming container. The apparatus includes: a first vaporizer configured to vaporize a first raw material in a solid state, and supply the vaporized first raw material gas to the substrate; a second vaporizer configured to vaporize a second raw material in a liquid state, and supply the vaporized second raw material gas to the substrate; a first pressure measurement unit configured to measure the internal pressure of the first vaporizer; a second pressure measurement unit configured to measure the internal pressure of the second vaporizer; and a controller configured to calculate a supply amount of the first and second raw material gases by the first and second pressure measurement units, respectively, and control the first and second vaporizers to supply the first and second raw material gases in a uniform amount.

10 Claims, 18 Drawing Sheets

(56) References Cited

U.S. PATENT DOCUMENTS

| | | | |
|---|---|---|---|
| 2011/0111136 A1* | 5/2011 | Slevin et al. | 427/569 |
| 2011/0236569 A1* | 9/2011 | Weiller et al. | 427/162 |
| 2012/0180719 A1* | 7/2012 | Inoue et al. | 118/708 |
| 2012/0304930 A1* | 12/2012 | Verdict et al. | 118/715 |
| 2013/0019960 A1* | 1/2013 | Choi et al. | 137/334 |
| 2014/0161966 A1* | 6/2014 | Lee et al. | 427/8 |

FOREIGN PATENT DOCUMENTS

| | | |
|---|---|---|
| JP | 2004-263230 A | 9/2004 |
| JP | 4283910 B2 | 6/2009 |
| JP | 2009-194099 A | 8/2009 |

* cited by examiner

FILM FORMING APPARATUS

CROSS-REFERENCE TO RELATED APPLICATION

This application claims the benefit of Japanese Patent Application No. 2011-6057, filed on Jan. 14, 2011, in the Japan Patent Office, the disclosure of which is incorporated herein in its entirety by reference.

TECHNICAL FIELD

The present disclosure relates to an apparatus for forming a polyimide film on a substrate.

BACKGROUND

Materials used for a semiconductor device is extending from inorganic material to organic material. With this change, the characteristics of a semiconductor device or a fabrication process can be further optimized by using special characteristic or the like of organic materials which is not present in inorganic materials.

One such organic material may be polyimide. Polyimide has high adhesion and also has a low leak current. Thus, a polyimide film obtained by forming polyimide on a surface of a substrate may be used as an insulating layer, and it may also be used as an insulating layer in a semiconductor device.

As a method for forming such a polyimide film, a film forming method is used based on the deposition of polymerization using, for example, pyromellitic dianhydride (PMDA) and 4,4'-diaminodiphenylether including, for example, 4,4'-oxydianiline (ODA), as raw material monomers. The deposition polymerization is a method for thermally polymerizing PMDA and ODA used as raw material monomers on a surface of a substrate by sublimating them. A film forming method is also used for forming a polyimide film by evaporating the monomers of PDMA and ODA with a vaporizer, supplying the evaporated vapor of each of the PDMA and ODA to a deposition polymerization chamber, and deposition-polymerizing the same on the substrate.

In order to form a polyimide film having excellent film quality by using deposition polymerization at a low cost and within short time, it is required to continuously supply a fixed amount of a PMDA gas obtained by vaporizing PMDA and an ODA gas obtained by vaporizing ODA to the substrate. In particular, PMDA is a solid raw material and has sublimation properties. In some instances, a film forming apparatus for forming a polyimide film includes a vaporizer installed at an outer side of a film forming container in order to sublimate PMDA, a solid raw material, and supply the PMDA in the sublimated state to the film forming container.

However, the film forming apparatus for forming a polyimide film by supplying the PMDA gas and the ODA gas to the substrate has the following problems.

In order to form a polyimide film on the surface of the substrate by supplying the PMDA gas and the ODA gas, a monomer of PMDA and a monomer of ODA are required to be polymerized on the surface of the substrate. However, when the ratio between a supply amount of the PMDA gas and that of the ODA gas on the surface of the substrate is changed, a film formation rate of the polyimide film is easily changed, degrading the uniformity of film thickness, film quality and the like of the polyimide film within the surface of the substrate.

In order to make the ratio between the supply amount of the PMDA gas and that of the ODA gas uniform, it is preferred to make both the supply amount of the PMDA gas and that of the ODA gas uniform. However, when the internal pressure of the vaporizer vaporizing PMDA changes, a supply amount of the PMDA gas is changed. Also, when the internal pressure of the vaporizer vaporizing ODA is changed, a supply amount of the ODA gas is changed.

In addition, the foregoing issue is common even when a polyimide film is formed by supplying a raw material gas comprised of an aromatic acid dianhydride including the PMDA gas and a raw material gas comprised of an aromatic diamine including the ODA gas to the substrate.

SUMMARY

According to one aspect of the present disclosure, there is provided a film forming apparatus for forming a polyimide film on a substrate installed within a film forming container by supplying a first raw material gas obtained by vaporizing a first raw material comprised of an aromatic acid dianhydride and a second raw material gas obtained by vaporizing a second raw material comprised of an aromatic diamine to the substrate. The apparatus includes: a first vaporizer installed such that an internal pressure thereof can be adjustable, and configured to vaporize the first raw material in a solid state, and supply the vaporized first raw material gas to the substrate; a second vaporizer installed such that an internal pressure thereof can be adjustable, and configured to vaporize the second raw material in a liquid state, and supply the vaporized second raw material gas to the substrate; a first pressure measurement unit configured to measure the internal pressure of the first vaporizer; a second pressure measurement unit configured to measure the internal pressure of the second vaporizer; and a controller configured to calculate a supply amount of the first raw material gas based on first data measured by the first pressure measurement unit, calculating a supply amount of the second raw material gas based on second data measured by the second pressure measurement unit, and control the first and second vaporizers such that the calculated supply amount of the first raw material gas and the calculated supply amount of the second raw material gas are uniform, respectively.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

An embodiment of the present disclosure will now be described in detail with reference to the drawings.

Embodiment

First, a film forming apparatus according to an embodiment of the present disclosure will be described. The film forming apparatus according to the present embodiment forms a polyimide film on a substrate by supplying a first raw material gas obtained by vaporizing a first raw material comprised of aromatic acid dianhydride and a second raw material gas obtained by vaporizing a second raw material comprised of aromatic diamine to the substrate maintained within a film forming container.

Also, preferably, the aromatic acid dianhydride is pyromellitic dianhydride (hereinafter, abbreviated to "PMDA"), and the aromatic diamine is 4,4'-diaminodiphenyl ether including, for example, 4,4'-oxydianiline (hereinafter, abbreviated to "ODA"). Also, the substrate on which the polyimide film is formed may be a semiconductor wafer (hereinafter, referred to as a "wafer W"). Hereinafter, a film forming apparatus for forming a polyimide film on a wafer W by supplying vaporized PMDA gas and vaporized ODA gas to the wafer W installed within a film forming container will be described as an example.

Figure 1:
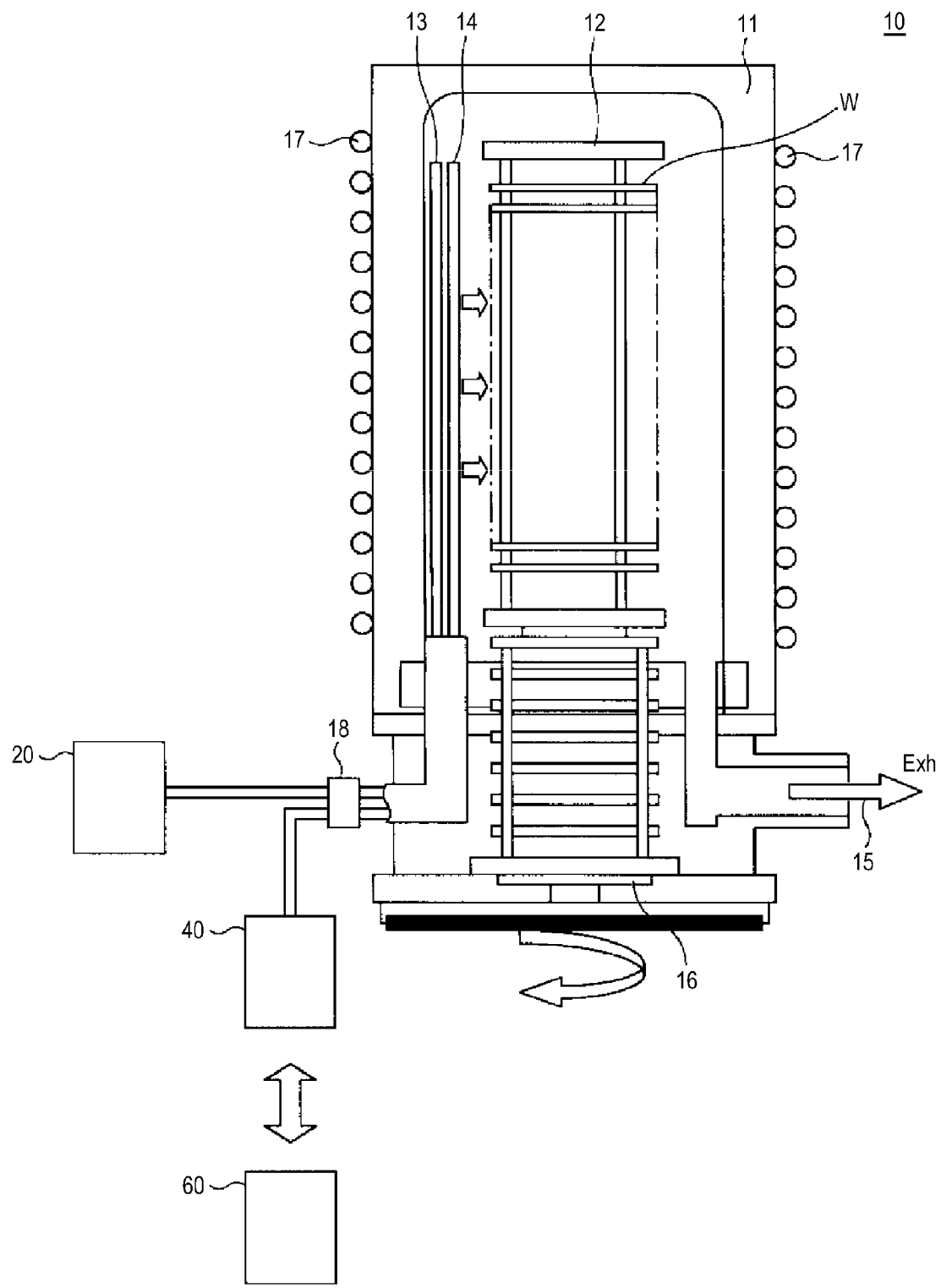
FIG. 1 is a partial vertical sectional view showing the configuration of a film forming apparatus according to an embodiment of the present disclosure.

FIG. 1 is a partial vertical-sectional view showing the configuration of a film forming apparatus according to an embodiment of the present disclosure.

A film forming apparatus 10 according to the present embodiment includes a film forming container 11, a first raw material gas supply unit 20, a second raw material gas supply unit 40, and a controller 60.

The film forming apparatus 10 includes a wafer boat 12 on which a plurality of wafers W, on which a polyimide film is formed, can be installed within the chamber 11 which can be exhausted by a vacuum pump (not shown) or the like. Also, the chamber 11 includes injectors 13 and 14 for supplying vaporized PMDA (PMDA gas) and vaporized ODA (ODA gas). An opening is formed on the side of the injectors 13 and 14 to allow the PMDA (PMDA gas) and ODA (ODA gas) vaporized by a vaporizer to be supplied to the wafers W as indicated by the arrows in the drawing. The supplied vaporized PMDA (PMDA gas) and ODA (ODA gas) react on the wafers W to form a polyimide film according to deposition polymerization. Also, vaporized PMDA (PMDA gas), ODA (ODA gas) and the like, which have not contributed to the formation of the polyimide film, flow as they are so as to be discharged from an exhaust 15 outside of the chamber 11. Further, in order to uniformly form a polyimide film on each of the wafers W, the wafer boat 12 is configured to be rotated by a rotary unit 16. Also, a heater 17 for heating the wafers W within the chamber 11 at a certain temperature is installed outside the chamber 11.

Further, the chamber 11 is equivalent to a film forming container in the present disclosure.

Also, the first raw material gas supply unit 20 and the second raw material gas supply unit 40 are connected to the injectors 13 and 14 through an introduction unit 18, and vaporized PMDA gas and ODA gas are supplied from the first raw material gas supply unit 20 and the second raw material gas supply unit 40.

The first raw material gas supply unit 20 includes a first vaporizer 21 as described later with reference to FIG. 2. The first vaporizer 21 heats a first raw material comprised of PMDA to be sublimated (vaporized; hereinafter, "sublimated" may be referred to as "vaporized"), and supplies a first raw material gas comprised of PMDA gas obtained through the vaporization along with a first carrier gas comprised of nitrogen gas ($N_2$ gas) to the chamber 11. The first carrier gas serves to transfer the first raw material gas comprised of the PMDA gas.

The second raw material gas supply unit 40 includes a second vaporizer 41 as described later with reference to FIG. 2. The second vaporizer 41 heats a second raw material comprised of ODA to vaporize it, and supplies a second raw material gas comprised of ODA gas obtained through the vaporization along with a second carrier gas comprised of a nitrogen gas ($N_2$ gas) to the chamber 11. The second carrier gas serves to transfer the second raw material gas comprised of the ODA gas and bubble ODA in a liquid state.

The PMDA gas supplied from the first raw material gas supply unit 20 and the ODA gas supplied from the second raw material gas supply unit 40 are supplied into the injectors 13 and 14, respectively. And then, the PMDA gas and the ODA gas are supplied from the injectors 13 and 14 to the chamber 11, respectively, and react on the wafers W to form a polyimide film.

Also, in the present embodiment, as one example, the film forming apparatus collectively performs the film formation processing as batch processing in a state in which a plurality of sheets of wafers W are supported in a stacking manner. However, the film forming apparatus is not limited to the film forming apparatus performing batch processing, but may also be a film forming apparatus processing the wafers W one by one.

Figure 2:
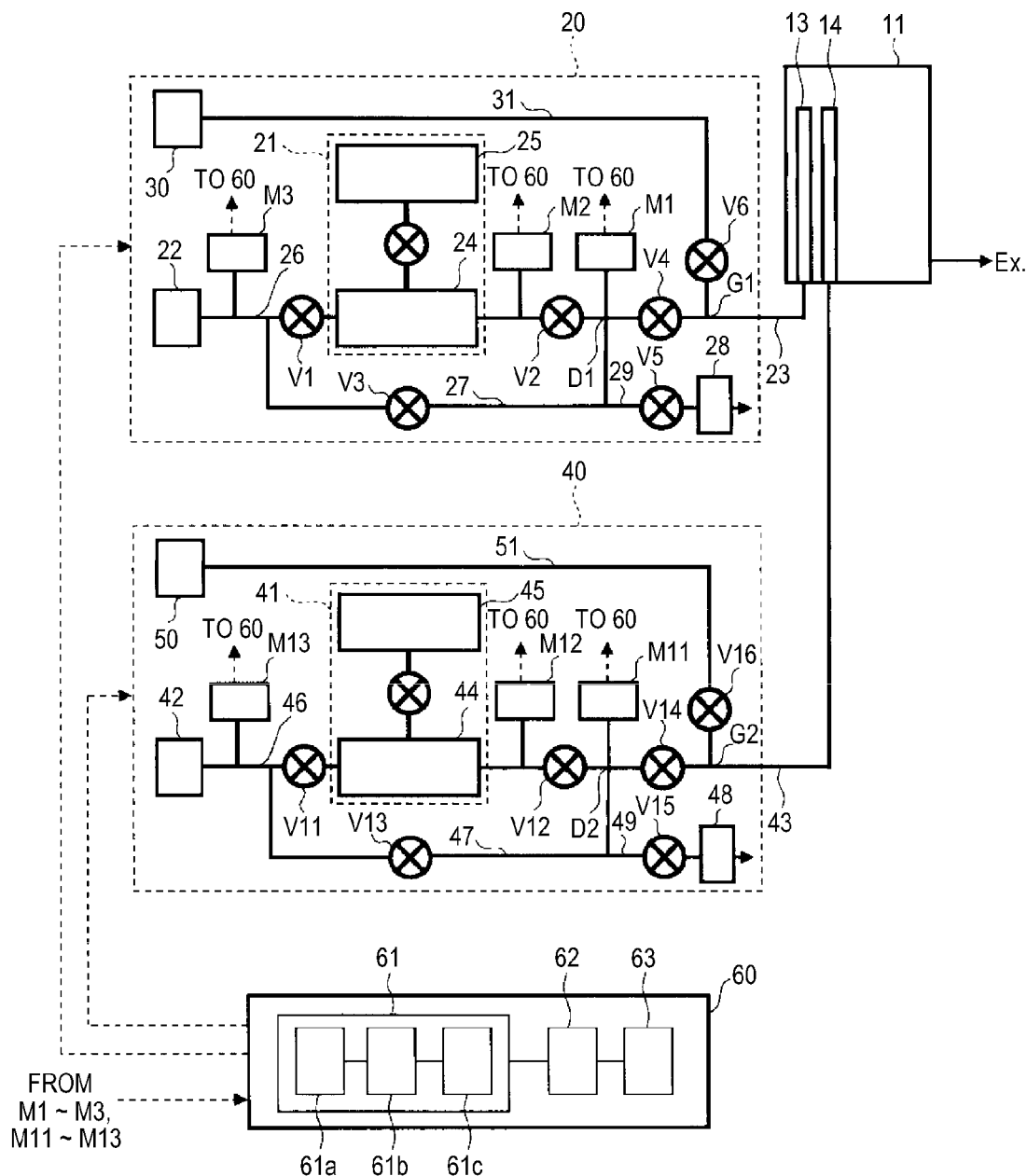
FIG. 2 is a view showing the configuration of a raw material gas supply unit and a controller in the film forming apparatus according to an embodiment of the present disclosure.

FIG. 2 is a view showing the configuration of the raw material gas supply units 20 and 40 and the controller 60 in the film forming apparatus according to the present embodiment.

As described above, the first raw material gas supply unit 20 supplies the PMDA gas and the second raw material gas supply unit 40 supplies the ODA gas.

The first raw material gas supply unit 20 includes the first vaporizer 21 and a first carrier gas supply unit 22.

The first vaporizer 21 is installed such that an internal pressure thereof can be adjusted, heats the PMDA in a solid state to sublimate (vaporize) it, and supplies a PMDA gas obtained by vaporizing the PMDA to the chamber 11. The first vaporizer 21 is connected with an injector 13 within the chamber 11 through a first supply flow path 23 allowing the PMDA gas to flow therealong. The first vaporizer 21 includes a first heating unit 24 and a first supply unit 25 as described later.

The first carrier gas supply unit 22 serves to supply a first carrier gas to be transferred to the first vaporizer 21. The first carrier gas supply unit 22 is connected to the opposite side of the chamber 11 of the first vaporizer 21 through a first carrier gas supply flow path 26 allowing the first carrier gas to flow therealong. As the first carrier gas, for example, nitrogen ($N_2$) gas heated to have a high temperature of 260 degrees C. may be used.

A valve V1 for initiating or stopping supply of the first carrier gas from the first carrier gas supply unit 22 is installed on the first carrier gas supply flow path 26 between the first vaporizer 21 and the first carrier gas supply unit 22. A valve V2 for initiating or stopping supply of the PMDA gas from the first vaporizer 21 is installed on the first supply flow path 23 at the chamber 11 side of the first vaporizer 21.

A first manometer M1 is installed on the first supply flow path 23. As described later, a supply amount of the first raw material gas is dependent on the pressure P1 measured by the first manometer M1. Thus, a supply amount of the first raw material gas can be calculated based on the pressure P1 measured by the first manometer M1.

Also, the first manometer M1 is in some embodiments installed at the first supply flow path 23 and the chamber 11 side of the valve V2. Accordingly, when a first bypass flow path 27 to be described later is installed, the valves V1 and V2 are closed to thereby allow the first carrier gas to be diverted from the first vaporizer 21.

Also, as shown in FIG. 2, a third manometer M2 may be installed at the first supply flow path 23 and the first vaporizer 21 side of the valve V2. Here, the valve V2 is in some embodiments installed such that the first supply flow path 23 is tightened by the valve V2 in an open state. Since the first supply flow path 23 is tightened by the valve V2, there is a pressure difference between both sides of the valve V2, namely, between the pressure P1 measured by the first manometer M1 and the pressure P2 measured by the third manometer M2. Also, the pressure difference is dependent upon a flow rate of a fluid flowing along the first supply flow path 23. Thus, conductance and a flow rate of the first supply flow path 23 can be calculated based on the pressure P1 measured by the first manometer M1 and the pressure P2 measured by the third manometer M2.

Also, the valve V2 is equivalent to a first tightening unit in the present disclosure. Alternatively, for example, a different tightening unit such as a needle valve or the like may be installed in series with the valve V2 on the first supply flow path 23 in order to tighten the first supply flow path 23 when the valve V2 is open.

Further, a fifth manometer M3 may be installed on the first carrier gas supply flow path 26. Here, when a flow rate of the first carrier gas is changed, the pressure P2 measured by the third manometer M2 and a pressure P3 measured by the fifth manometer M3 are changed. Also, when a filling amount or a filling state of raw material powder is changed in the first vaporizer 21, the conductance of the first vaporizer 21 is changed and the pressure difference between the pressure P2 measured by the third manometer M2 and the pressures P3 measured by the fifth manometer M3 is changed. Thus, a flow rate of the first carrier gas and the conductance of the first vaporizer 21 can be calculated based on the pressure P2 measured by the third manometer M2 and the pressure P3 measured by the fifth manometer M3.

Also, the manometers M1, M2, and M3 correspond to a first pressure measurement unit in the present disclosure.

Further, as shown in FIG. 2, the first carrier gas supply flow path 26 at the first carrier gas supply unit 22 side of the valve V1 and the first supply flow path 23 at the chamber 11 side of the valve V2 may be connected through the first bypass flow path 27 to bypass the first vaporizer 21. Here, in some embodiments, the valve V3 for switching whether to connect the first carrier gas supply unit 22 and the first supply flow path 23 through the first vaporizer 21 or through the first bypass flow path 27 is installed in the middle of the first bypass flow path 27. In some instances, the first bypass flow path 27 is installed to be branched from the first carrier gas supply flow path 26 at the first carrier gas supply unit 22 side of the valve V3. Further, in some circumstances, the first bypass flow path 27 is installed to join the first supply flow path 23 at a diverging point D1 at the chamber 11 side of the valve V2.

Also, the first bypass flow path 27 is equivalent to a first bypass flow path.

If the valves V1 and V2 are open and the first bypass flow path 27 is installed, when the valve V3 is closed, the first manometer M1 may measure a pressure equivalent to the sum of a partial pressure of the PMDA gas and a partial pressure of the first carrier gas in the first supply flow path 23. Also, if the valves V1 and V2 are closed and the first bypass flow path 27 is installed, when the valve V3 is open, the first manometer M1 may measure a pressure equivalent to a partial pressure of the first carrier gas in the first supply flow path 23.

The first raw material gas supply unit 20 may have a first discharge unit 28 connected to the first vaporizer 21 such that the first discharge unit 28 can be switched with the chamber 11. The first discharge unit 28 serves to discharge the PMDA gas from the first vaporizer 21. In some embodiments, the first discharge unit 28 is installed in the middle of the first supply flow path 23 so as to be branched from and connected to the first supply flow path 23. Also, as shown in FIG. 2, in some instances, the first discharge unit 28 is installed to be connected to the first supply flow path 23 through a first discharge flow path 29 at the diverging point D1. Here, a valve V4 may be installed at the chamber 11 side, rather than the diverging point D1 of the first supply flow path 23. Also, a valve V5 may be installed between the diverging point D1 of the first discharge flow path 29 and the first discharge unit 28. The valves V4 and V5 serve to connect the first vaporizer 21 to the first discharge unit 28 such that the first discharge unit 28 can be switched with the chamber 11.

The first raw material gas supply unit 20 may include a first adjustment gas supply unit 30 for supplying a first flow rate adjustment gas for adjusting a flow rate of the carrier gas carrying the PMDA gas. In some embodiments, the first adjustment gas supply unit 30 is connected to join the first supply flow path 23 in the middle of the first supply flow path 23 along which the PMDA gas flows from the first vaporizer 21 to the chamber 11. Also, as shown in FIG. 2, in some embodiments, the first adjustment gas supply unit 30 is installed to be connected to the first supply flow path 23 through a first adjustment gas supply flow path 31 at a converging point G1 at the chamber 11 side, rather than at the diverging point D1. Here, a valve V6 may be installed between the converging point G1 of the first adjustment gas supply flow path 31 and the first adjustment gas supply unit 30.

Further, a piping constituting the first supply flow path 23, the first carrier gas supply flow path 26, and the first adjustment gas supply flow path 31 may be covered by an insulating member. Also, a heating mechanism (not shown) may be provided at the insulating member in order to introduce a first carrier gas heated to have a temperature higher than room temperature, for example, to have a temperature of 260 degrees C. into the first vaporizer 21 and at the same time prevent the temperature of the PMDA gas and the first carrier gas derived from the first vaporizer 21 from being lowered.

In addition, when the valves V1 and V2 are open, a flow rate of the first carrier gas from the first carrier gas supply unit 22 may be regulated, or the first vaporizer 21 is exhausted by the first discharge unit 28, whereby the pressure of the interior of the first vaporizer 21 can be adjusted.

The second raw material gas supply unit 40 includes the second vaporizer 41 and a second carrier gas supply unit 42.

The second vaporizer 41 is installed such that an internal pressure thereof can be adjusted, and serves to heat and bubble the ODA in a liquid state to be vaporized so as to supply the vaporized ODA gas to the chamber 11. The second vaporizer 41 is connected with an injector 14 within the chamber 11 through a second supply flow path 43 allowing the ODA gas to flow therealong. The second vaporizer 41 includes a second heating unit 44 and a second supply unit 45 as described later.

The second carrier gas supply unit 42 serves to supply a second carrier gas to be bubbled and to be transferred to the second vaporizer 41. The second carrier gas supply unit 42 is connected to the opposite side of the chamber 11 of the second vaporizer 41 through a second carrier gas supply flow path 46 allowing the second carrier gas to flow therealong. As the second carrier gas, for example, nitrogen ($N_2$) gas heated to have a high temperature of 220 degrees C. may be used.

A valve V11 for initiating or stopping supplying of the second carrier gas from the second carrier gas supply unit 42 is installed on the second carrier gas supply flow path 46 between the second vaporizer 41 and the second carrier gas supply unit 42. A valve V12 for initiating or stopping supply of the ODA gas from the second vaporizer 41 is installed on the second supply flow path 43 at the chamber 11 side of the second vaporizer 41.

A second manometer M11 is installed on the second supply flow path 43. As described later, a supply amount of the second raw material gas is dependent on a pressure P11 measured by the second manometer M11. Thus, a supply amount of the second raw material gas can be calculated based on the pressure P11 measured by the second manometer M11.

Also, the second manometer M11 is in some embodiments installed at the second supply flow path 43 and the chamber 11 side of the valve V12. Accordingly, when a second bypass flow path 47 to be described later is installed, the valves V11 and V12 are closed to thereby allow the second carrier gas to flow by bypassing the second vaporizer 41.

Also, as shown in FIG. 2, a fourth manometer M12 may be installed at the second supply flow path 43 and the second vaporizer 41 side of the valve V12. Here, the valve V12 is in some instances installed such that the second supply flow path 43 is tightened by the valve V12 in an open state. Since the second supply flow path 43 is tightened by the valve V12, a pressure difference occurs between both sides of the valve V12, namely, between the pressure P11 measured by the second manometer M11 and the pressure P12 measured by the fourth manometer M12. Also, the pressure difference is dependent upon a flow rate of a fluid flowing along the second supply flow path 43. Thus, conductance and a flow rate of the second supply flow path 43 can be calculated based on the pressure P11 measured by the second manometer M11 and the pressure P12 measured by the fourth manometer M12.

Also, the valve V12 is equivalent to a second tightening unit in the present disclosure. Alternatively, for example, a different tightening unit such as a needle valve or the like may be installed in series with the valve V12 on the second supply flow path 43 in order to tighten the second supply flow path 43 when the valve V12 is open.

Further, a sixth manometer M13 may be installed on the second carrier gas supply flow path 46. Here, when a flow rate of the second carrier gas is changed, the pressure P12 measured by the fourth manometer M12 and a pressure P13 measured by the sixth manometer M13 are changed. Also, when a filling amount or a filling state of liquid raw material is changed in the second vaporizer 41, the conductance of the second vaporizer 41 is changed and the pressure difference between the pressure P12 measured by the fourth manometer M12 and the pressures P13 measured by the sixth manometer M13 is changed. Thus, a flow rate of the second carrier gas and the conductance of the second vaporizer 41 can be calculated based on the pressure P12 measured by the fourth manometer M12 and the pressure P13 measured by the sixth manometer M13.

Also, the manometers M11, M12, and M13 correspond to a second pressure measurement unit in the present disclosure.

Further, as shown in FIG. 2, the second carrier gas supply flow path 46 at the second carrier gas supply unit 42 side of the valve V11 and the second supply flow path 43 at the chamber 11 side of the valve V12 may be connected through the second bypass flow path 47 detouring the second vaporizer 41. Here, in some embodiments, the valve V13 for switching whether to connect the second carrier gas supply unit 42 and the second supply flow path 43 through the second vaporizer 41 or through the second bypass flow path 47 is installed in the middle of the second bypass flow path 47. In some embodiments, the second bypass flow path 47 is installed to be branched from the second carrier gas supply flow path 46 at the second carrier gas supply unit 42 side of the valve V13. Further, in some instances, the second bypass flow path 47 is installed to join the second supply flow path 43 at a diverging point D2 at the chamber 11 side of the valve V12.

Also, the second bypass flow path 47 is equivalent to a second bypass flow path in the present disclosure.

If the valves V11 and V12 are open and the second bypass flow path 47 is installed, when the valve V13 is closed, the fourth manometer M12 may measure a pressure equivalent to the sum of a partial pressure of the ODA gas and a partial pressure of the second carrier gas in the second supply flow path 43. Also, if the valves V11 and V12 are closed and the second bypass flow path 47 is installed, when the valve V13 is open, the fourth manometer M12 may measure a pressure equivalent to a partial pressure of the second carrier gas in the second supply flow path 43.

The second raw material gas supply unit 40 may have a second discharge unit 48 connected to the second vaporizer 41 such that the second discharge unit 48 can be switched with the chamber 11. The second discharge unit 48 serves to discharge the ODA gas from the second vaporizer 41. In some embodiments, the second discharge unit 48 is installed in the middle of the second supply flow path 43 so as to be branched from and connected to the second supply flow path 43. Also, as shown in FIG. 2, in some instances, the second discharge unit 48 is installed to be connected to the second supply flow path 43 through a second discharge flow path 49 at the diverging point D2. Here, a valve V14 may be installed at the chamber 11 side, rather than the diverging point D2 of the second supply flow path 43. Also, a valve V15 may be installed between the diverging point D2 of the second discharge flow path 49 and the second discharge unit 48. The valves V14 and V15 serve to connect the second discharge unit 48 to the second vaporizer 41 such that the second discharge unit 48 can be switched with the chamber 11.

The second raw material gas supply unit 40 may include a second adjustment gas supply unit 50 for supplying a second flow rate adjustment gas for adjusting a flow rate of the carrier gas carrying the ODA gas. In some embodiments, the second adjustment gas supply unit 50 is connected to join the second supply flow path 43 in the middle of the second supply flow path 43 along which the ODA gas flows from the second vaporizer 41 to the chamber 11. Also, as shown in FIG. 2, in some embodiments, the second adjustment gas supply unit 50 is installed to be connected to the second supply flow path 43 through a second adjustment gas supply flow path 51 at a converging point G2 at the chamber 11 side, rather than at the diverging point D2. Here, a valve V16 may be installed between the converging point G2 of the second adjustment gas supply flow path 51 and the second adjustment gas supply unit 50.

Further, a piping constituting the second supply flow path 43, the second carrier gas supply flow path 46, and the second adjustment gas supply flow path 51 may be covered by an insulating member. Also, a heating mechanism (not shown) may be provided at the insulating member in order to introduce a second carrier gas heated to have a temperature higher than room temperature, for example, to have a temperature of 220 degrees C. into the second vaporizer 41 and prevent the temperature of the ODA gas and the second carrier gas derived from the second vaporizer 41 from being lowered.

In addition, when the valves V11 and V12 are open, a flow rate of the second carrier gas from the second carrier gas supply unit 42 may be regulated, or the second vaporizer 41 is exhausted by the second discharge unit 48, whereby the pressure of the interior of the second vaporizer 41 can be adjusted.

The controller 60 includes, for example, a calculation processing unit 61, a memory unit 62, and a display unit 63. The calculation processing unit 61 is a computer having, for example, a central processing unit (CPU).

The memory unit 62 is a computer-readable recording medium configured by, for example, a hard disk storing a program for executing various processes in the calculation processing unit 61. The display unit 63 is configured as, for example, a screen of a computer. The calculation processing unit 61 reads the program stored in the memory unit 62 and transmits a control signal to each component constituting the first raw material gas supply unit 20 and each component constituting the second raw material gas supply unit 40 according to the program to execute film formation processing as described later.

Further, the calculation processing unit 61 includes a calculation unit 61a, a detection unit 61b, and an alarm generation unit 61c.

The calculation unit 61a calculates a supply amount of the first raw material gas based on the pressures P1 to P3 measured by the manometers M1 to M3. Similarly, the calculation unit 61a calculates a supply amount of the second raw material gas based on the pressures P11 to P13 measured by the manometers M11 to M13.

Also, the calculation unit 61a may calculate a supply amount of the first raw material gas based on the pressure P2 measured by the third manometer M2 and the pressure P1 measured by the first manometer M1. Similarly, the calculation unit 61a may calculate a supply amount of the second raw material gas based on the pressure P12 measured by the fourth manometer M12 and the pressure P11 measured by the second manometer M11.

Also, the calculation unit 61a may calculate conductance of the first vaporizer 21 based on the pressure P3 measured by the fifth manometer M3 and the pressure P1 measured by the first manometer M1. Similarly, the calculation unit 61a may calculate conductance of the second vaporizer 41 based on the pressure P13 measured by the sixth manometer M13 and the pressure P11 measured by the second manometer M11.

The memory unit 62 may store the pressures P1 to P3 and P11 to P13 measured by the manometers M1 to M3 and M11 to M13 during a normal operation as reference data in advance. Further, the detection unit 61b may compare the pressures P1 to P3 measured by the manometers M1 to M3 with reference data read from the memory unit 62 to detect whether or not a supply amount of the first raw material gas is within a certain range, in film formation processes to be described later. Similarly, the detection unit 61b may compare the pressures P11 to P13 measured by the manometers M11 to M13 with reference data read from the memory unit 62 to detect whether or not a supply amount of the second raw material gas is within a certain range, in film formation processes to be described later.

Also, the pressures P1 to P3 measured in film formation processes are equivalent to first data in the present disclosure and the pressures P11 to P13 measured in film formation processes are equivalent to second data in the present disclosure.

Next, the first vaporizer 21 will be described.

The first vaporizer 21 supplies the PMDA gas to the film forming apparatus 10.

Figure 3:
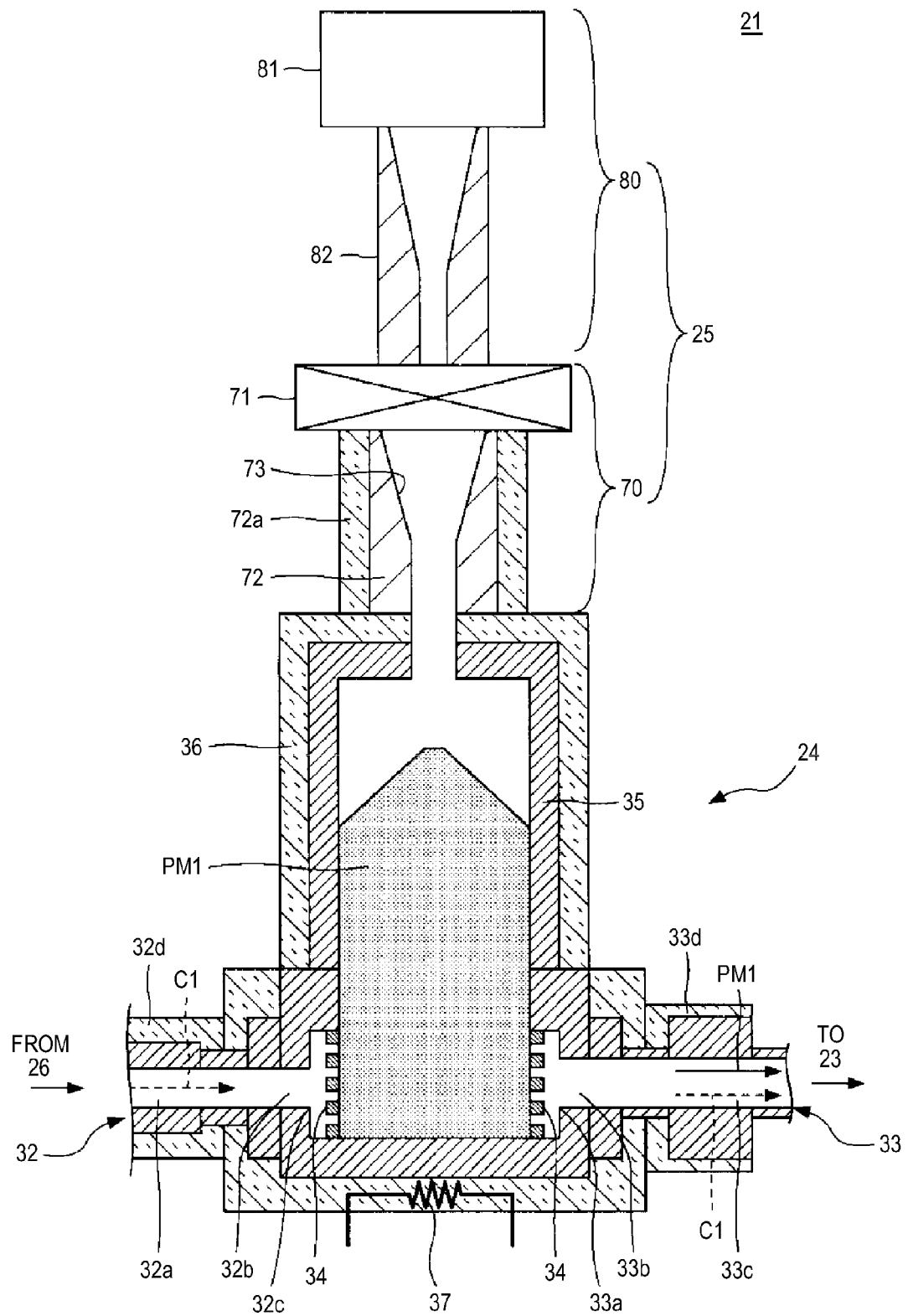
FIG. 3 is a partial vertical sectional view showing the configuration of a first vaporizer.

FIG. 3 is a partial vertical sectional view showing the configuration of the first vaporizer 21.

The first vaporizer 21 according to the present embodiment includes a first heating unit 24, a first supply unit 25, a first gas introduction unit 32, and a first gas extraction unit 33. The first heating unit 24 is installed such that an internal pressure thereof is adjustable, and serves to heat PMDA to sublimate the same. The first supply unit 25 is installed above the first heating unit 24 and supplies PMDA to the first heating unit 24. The first gas introduction unit 32 introduces a first carrier gas C1 for carrying the PMDA gas, which has been vaporized by the first heating unit 24, into the first heating unit 24. The first gas extraction unit 33 extracts the PMDA gas PM1 which has been vaporized along with the first carrier gas C1 from the first heating unit 24.

The first heating unit 24 is filled with the PMDA raw material in a solid state (hereinafter, referred to as "PMDA raw material powder") and heats the PMDA raw material powder PM1 filling the first heating unit 24 to be vaporized.

An upper portion of the first heating unit 24 communicates with a partition valve unit 70 of the first supply unit 25 as described later. The first heating unit 24 is configured to allow the PDMA raw material powder to be dropped and supplied by the first supply unit 25 to a certain point, e.g., a substantial central point or the like of the first heating unit 24 as an impact point, through a lower raw material supply pipe 72 of the partition valve unit 70. Here, the first heating unit 24 may be configured such that the PMDA raw material powder is dropped to be supplied by the first supply unit 25, so that the PMDA raw material powder filling the interior of the first heating unit 24 maintains an upper surface having a conical shape sloped by an angle of repose of, e.g., 45 degrees, from the level based on the impact point as the peak.

The first heating unit 24 may include a mesh portion 34 formed at a lower portion of a lateral side. The mesh portion 34 serves to maintain the PMDA raw material powder filling the interior of the first heating unit 24 and allow a gas to pass through between an outer side and an inner side of the first heating unit 24. The mesh portion 34 is configured as a mesh of a metal such as, for example, aluminum or the like. The size of the mesh of the mesh portion 34 may be smaller than a particle diameter of the PMDA raw material powder. The PMDA raw material, which filled the first supply unit 25, currently fills the interior of the first heating unit 24 surrounded by an inner wall 35 including the mesh portion 34.

Further, as for a particle size distribution of the PMDA raw material powder, for example, the content of particles having an average particle diameter ranging from about 200 to 300 μm, having a particle diameter of 100 μm or smaller is about 1%. Also, when the PMDA raw material powder having such a particle size distribution is used, for example, the size of the mesh of the mesh portion 34 may be about 100 μm.

The first heating unit 24 is surrounded by an insulating member 36. As part of the insulating member 36, a heating mechanism 37 is installed in the vicinity of the first heating unit 24 and heats the PMDA raw material powder filling the interior of the first heating unit 24 to sublimate (vaporize) the same. A heater or the like may be used as the heating mechanism 37. Also, the heating mechanism 37 may only need to heat the first heating unit 24, and may be installed at a certain position of the first vaporizer 21, rather than in the vicinity of the first heating unit 24.

In addition, the first heating unit 24 may be installed such that the pressure in the interior thereof may be adjustable by adjusting the temperature of the first heating unit 24 by the heating mechanism 37. Alternatively, the first heating unit 24 may be installed such that the pressure in the interior thereof may be adjustable by adjusting a flow rate of the first carrier gas from the first carrier gas supply unit 22.

The first gas introduction unit 32 includes a gas introduction pipe 32a, a gas introduction hole 32b, a gas introduction chamber 32c, and an insulating member 32d. The gas introduction pipe 32a is a pipe for introducing the first carrier gas C1 carrying the PMDA gas to the interior of the first heating unit 24 from outside of the first heating unit 24. One end of the gas introduction pipe 32a is connected to the gas introduction hole 32b and the other end portion thereof is connected to the first carrier gas supply flow path 26. The gas introduction hole 32b is an opening formed in the gas introduction chamber 32c. The gas introduction chamber 32c is installed to be adjacent to the first heating unit 24 within the first vaporizer 21.

The gas introduction pipe 32a may be covered by the insulating member 32d. Also, a heating mechanism (not shown) may be provided at the insulating member 32d in order to introduce the first carrier gas C1 heated to have a temperature higher than room temperature to the first heating unit 24.

The first gas extraction unit 33 includes a gas extraction chamber 33a, a gas extraction hole 33b, and a gas extraction pipe 33c. The gas extraction chamber 33a is installed to be adjacent to the first heating unit 24 and opposed to the first gas introduction unit 32 based on the first heating unit 24 within the first vaporizer 21. The gas extraction hole 33b is an opening formed in the gas extraction chamber 33a. The gas extraction pipe 33c is a pipe allowing the PMDA gas PM1 and the first carrier gas C1 to be extracted from the interior of the first vaporizer 21 outside of the first vaporizer 21. One end of the gas extraction pipe 33c is connected to the gas extraction hole 33b and the other end thereof is connected to the first supply flow path 23.

The gas extraction pipe 33c may be covered by an insulating member 33d. Also, a heating mechanism (not shown) may be provided at the insulating member 33d in order to extract the PMDA gas PM1 and the first carrier gas C1 heated to have a temperature higher than room temperature from the first heating unit 24.

The first supply unit 25 may be installed above the first heating unit 24 and supply the PMDA raw material powder by dropping the same to the first heating unit 24. The first supply unit 25 includes the partition valve unit 70 and a raw material storage unit 80. The partition valve unit 70 is installed at an upper portion of the first heating unit 24 and the raw material storage unit 80 is installed at a more upper portion of the partition valve unit 70.

The partition valve unit 70 includes a partition valve 71, the lower raw material supply pipe 72, and a fall guide mechanism 73. The partition valve 71 and the lower raw material supply pipe 72 are configured to be disposed in order of the partition valve 71 and the lower raw material supply pipe 72 from the upper side to the lower side. The partition valve 71 is an opening and closing mechanism for connecting or blocking the first heating unit 24 and the first supply unit 25. The lower raw material supply pipe 72 is installed to extend from the partition valve 71 to the first heating unit 24, i.e., from the upper side to the lower side, and drops the PMDA raw material powder to supply the same from the raw material storage unit 80 to the partition valve unit 70. Also, the circumference of the lower raw material supply pipe 72 is covered by an insulating member 72a. Further, the lower raw material supply pipe 72 includes a lower diffusion preventing portion 91b to be described later.

Also, the partition valve 71 may be heated.

The fall guide mechanism 73 is a tapered throttle installed at an upper portion of the lower raw material supply pipe 72 such that an inner diameter of the pipe is reduced toward the lower side from the upper side. The PMDA raw material powder falling from the raw material storage unit 80 can be stably supplied by the fall guide mechanism 73 to a certain position, for example, such as a substantial central point or the like of the first heating unit 24, as an impact point. As a result, the first supply unit 25 may fill the first heating unit 24 with the PMDA raw material powder such that the PMDA raw material powder filling the interior of the first heating unit 24 maintains an upper surface having a conical shape sloped by an angle of repose of, e.g., 45 degrees, from the level based on the impact point as the peak.

Figure 4:
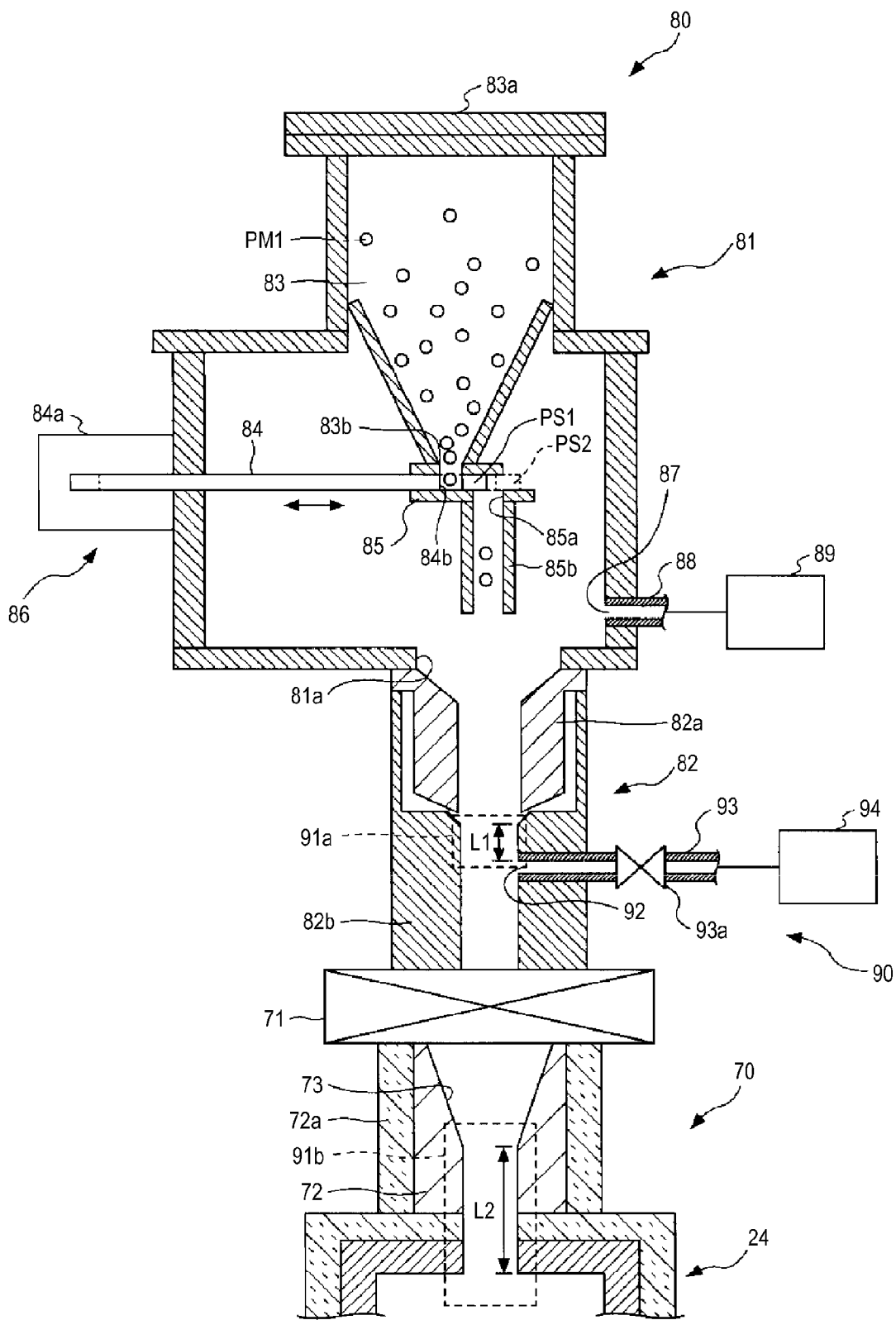
FIG. 4 is a sectional view schematically showing the configuration of a raw material storage unit.

FIG. 4 is a sectional view schematically showing the configuration of the raw material storage unit 80. Also, in FIG. 4, the partition valve 71, the lower raw material supply pipe 72, the fall guide mechanism 73 of the partition valve unit 70, and portions of the first heating unit 24 are also illustrated together with the raw material storage unit 80.

The raw material storage unit 80 includes a storage chamber 81 and an upper raw material supply pipe 82. The storage chamber 81 and the upper raw material supply pipe 82 are configured to be disposed in order of the storage chamber 81 and the upper raw material supply pipe 82 from the upper side to the lower side.

The storage chamber 81 is a space storing the PMDA raw material powder from the outside in the raw material storage unit 80. The storage chamber 81 includes a piston type supply mechanism 86 comprised of a powder tank 83, a piston plate 84, and a bottom plate member 85.

Further, the piston type supply mechanism 86 is equivalent to a supply mechanism in the present disclosure.

An upper cover 83a is installed on an upper portion of the storage chamber 81, and on an upper surface of the powder tank 83 to supply the PMDA raw material powder from outside the storage chamber 81. A lower portion of the powder tank 83 has a funnel-like shape having a diameter decreased toward the lower side from the upper side. A first opening 83b is installed at a lower end portion of the powder tank 83.

Also, the film forming apparatus 10 may include a raw material supply cartridge, as a separate body, for supplying the PMDA raw material powder to the storage chamber 81 from outside the storage chamber 81. The raw material supply cartridge and a method for supplying a raw material using the raw material supply cartridge will be described later with reference to FIG. 5.

The piston plate 84 is a flat plate installed to be, for example, reciprocally movable in a horizontal direction at a lower side of the first opening 83b installed at the lower end portion of the powder tank 83, and is reciprocally moved by, for example, an air cylinder 84a installed at an outer side of the storage chamber 81. The piston plate 84 includes a through hole 84b having substantially the same inner diameter as that of the first opening 83b installed in the powder tank 83 and vertically penetrating the piston plate 84.

The piston plate 84 is configured such that when the piston plate 84 is placed at a first position PS1, the through hole 84b communicates with the first opening 83b installed in the powder tank 83. Also, the bottom plate member 85 is installed under the piston plate 84. The bottom plate member 85 is configured to cover the through hole 84b at a lower side when the piston plate 84 is placed at the first position PS1.

Also, a space formed by the through hole 84b and the bottom plate member 85 is equivalent to an accommodation part for receiving the PMDA raw material powder from the powder tank 83 and accommodating the same therein.

A second opening 85a having substantially the same inner diameter as that of the through hole 84b is formed in the bottom plate member 85, and an introduction pipe 85b, which extends downwardly and is installed to be substantially coaxial with the upper raw material supply pipe 82, communicates with a lower side of the second opening 85a.

The piston plate 84 is configured such that when the piston plate 84 is placed at a second position PS2 different from the first position PS1, the through hole 84b communicates with the second opening 85a and covers the first opening 83b at the lower side.

The piston type supply mechanism 86 conveys the PMDA raw material powder having a volume (a certain amount) substantially equal to the capacity of the through hole 84b from the first opening 83b to the second opening 85a according to a reciprocal movement of the piston plate 84 between the first position PS1 and the second position PS2. That is, the piston type supply mechanism 86 reciprocally moves the piston plate 84 between the first position PS1 and the second position PS2 to receive the PMDA raw material powder in the accommodation part configured by the through hole 84b and the bottom plate member 85 from the powder tank 83 and drops the received PMDA raw material powder from the accommodation part to supply the same to the upper raw material supply pipe 82. Accordingly, a supply amount of the PMDA raw material powder per unit time can be freely adjusted by regulating an operational period of the piston plate 84.

Further, a supply amount of the PMDA raw material powder, which the accommodation part drops and supplies to the upper raw material supply pipe 82 after receiving from the powder tank 83 during a single reciprocal movement of the piston plate 84, can be adjusted by changing the volume of space formed by the through hole 84b and the bottom plate member 85.

Also, the powder tank 83 is equivalent to a storage unit in the present disclosure.

The upper cover 83a of the powder tank 83 is configured to airtightly maintain the interior of the storage chamber 81. Also, an exhaust mechanism (not shown) may be installed in the storage chamber 81 including the interior of the powder tank 83, or air may be exhausted by a diffusion preventing gas discharge unit 94 (to be described later) through a diffusion preventing gas extraction hole 92 of the upper raw material supply pipe 82 to maintain the interior of the storage chamber 81 airtightly in a vacuum state.

A diffusion preventing gas introduction hole 87 is formed in the storage chamber 81. A diffusion preventing gas supply unit 89 for supplying a diffusion preventing gas through an introduction pipe 88 is connected to the diffusion preventing gas introduction hole 87.

Also, a temperature adjustment unit (not shown) for adjusting the temperature of the PMDA raw material powder stored in the powder tank 83 may be installed in the storage chamber 81. In such a case, the PDMA raw material powder may be maintained at temperature of, for example, about 60 degrees C.

The upper raw material supply pipe 82 communicates with an opening 81a formed on a lower face of the storage chamber 81 and is installed to extend toward the partition valve 71 from the storage chamber 81, namely, from the upper side to the lower side to drop the PMDA raw material powder from the storage chamber 18 so as to be supplied to the partition valve 71.

The upper raw material supply pipe 82 is divided into an upper pipe member 82a and a lower pipe member 82b. A lower end portion of the upper pipe member 82a is installed so as not to be thermally in contact with the lower pipe member 82b. Accordingly, the temperature of the upper pipe member 82a can be prevented from increasing by heat conduction from the lower pipe member 82b, and an amount of thermal intrusion from a lower side to the storage chamber 81 can be reduced.

A tapered throttle is installed at an upper portion of the upper pipe member 82a and at a portion connected with the opening 81a such that an inner diameter of the pipe is reduced toward the lower side from the upper side, and a drop supply of the PMDA raw material powder to the upper raw material supply pipe 82 from the storage chamber 81 can be stabilized by the throttle.

The raw material storage unit 80 has a diffusion preventing mechanism 90. The diffusion preventing mechanism 90 includes the diffusion preventing gas introduction hole 87, an upper diffusion preventing unit 91a installed at the lower pipe member 82b, a lower diffusion preventing unit 91b installed in the lower raw material supply pipe 72, and the diffusion preventing gas extraction hole 92. The diffusion preventing mechanism 90 serves to prevent diffusion of the PMDA gas from the first heating unit 24 to the storage chamber 81 of the first supply unit 25.

The diffusion preventing gas extraction unit 92 is formed in the middle of the lower pipe member 82b. The diffusion preventing gas discharge unit 94 for discharging a diffusion preventing gas is connected to the diffusion preventing gas extraction hole 92 through an extraction pipe 93. An opening and closing mechanism 93a for connecting or disconnecting the diffusion preventing gas discharge unit 94 and the lower pipe member 82b is installed in the middle of the extraction pipe 93.

When the partition valve 71 is closed and the first heating unit 24 and the storage chamber 81 of the first supply unit 25 do not communicate with each other, namely, when the PDMA raw material powder is not supplied from the first supply unit 25 to the first heating unit 24, the opening and closing mechanism 93a is open. When the partition valve 71 is closed, a diffusion preventing gas comprised of, for example, $N_2$ gas introduced from the diffusion preventing gas introduction hole 87 flows to the diffusion preventing gas extraction hole 92 through the lower pipe member 82b. Accordingly, the PMDA gas can be prevented from being diffused from the upper diffusion preventing unit 91a side to the storage chamber 81 side.

As for the upper diffusion preventing unit 91a, when the length L1 from an upper end portion of the lower pipe member 82b to the diffusion preventing gas extraction hole 92 is L, the flow rate of the diffusion preventing gas (representative speed) is U, and a diffusion coefficient of the PMDA gas is d, in some instances, peclet number Pe represented by the following equation ranges from 10 to 100.

$$Pe=UL/d \quad \text{Eq. (1)}$$

Accordingly, the PMDA gas can be reliably prevented from diffusing from the upper diffusion preventing unit 91a side to the storage chamber 81 side. Also, in some embodiments, peclet number Pe represented by Eq. (1) ranges from 30 to 100. Accordingly, the PMDA gas can be more reliably prevented from diffusing from the upper diffusion preventing unit 91a side to the storage chamber 81 side.

Meanwhile, when the partition valve 71 is open and the first heating unit 24 and the storage chamber 81 of the first supply unit 25 communicate with each other, namely, when the PMDA raw material powder is supplied from the first supply unit 25 to the first heating unit 24, the opening and closing mechanism 93a is closed. When the partition valve 71 is open, the diffusion preventing gas comprised of, for example, $N_2$ gas, introduced from the diffusion preventing gas introduction hole 87 flows to the first supply flow path 23 through the lower pipe member 82b, the lower raw material supply pipe 72, and the first heating unit 24. Accordingly, the PMDA gas can be prevented from diffusing from the first heating unit 24 to the storage chamber 81 through the lower diffusion preventing unit 91b.

As for the lower diffusion preventing unit 91b, when the length L2 from a lower end portion of the fall guide mechanism 73 to an upper end portion of the first heating unit 24 is L, in some instances, peclet number Pe represented by Equation (1) ranges from 10 to 100. Accordingly, the PMDA gas can be reliably prevented from diffusing from the first heating unit 24 side to the storage chamber 81 side through the lower diffusion preventing unit 91b. Also, in some embodiments, peclet number Pe represented by Eq. (1) ranges from 30 to 100. Accordingly, diffusion of the PMDA gas from the first heating unit 24 side to the storage chamber 81 side through the lower diffusion preventing unit 91b can be more reliably prevented.

Figure 5:
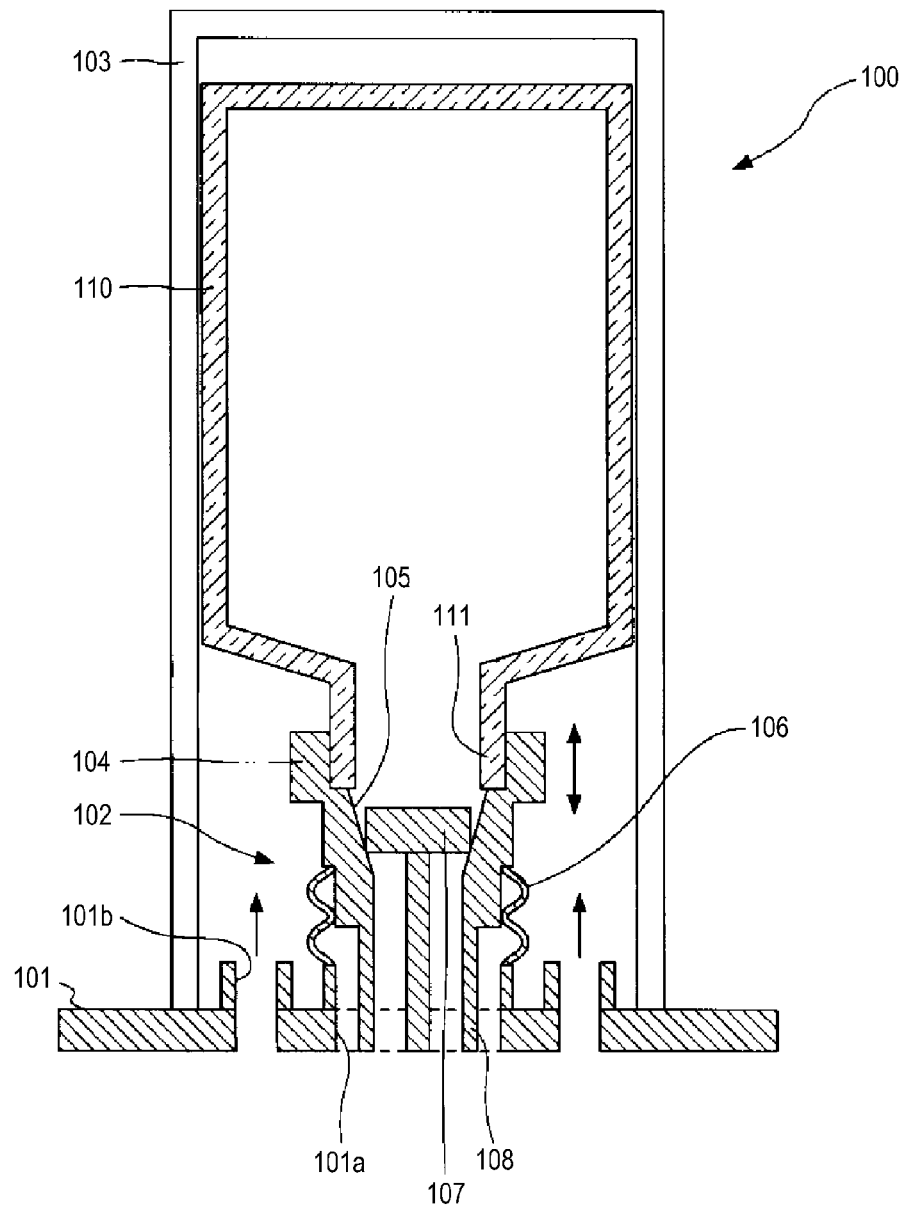
FIG. 5 is a sectional view schematically showing the configuration of a raw material supply cartridge.

Next, a raw material supply cartridge 100 provided in the foregoing film forming apparatus 10 will be described. FIG. 5 is a sectional view schematically showing the configuration of the raw material supply cartridge 100.

The raw material supply cartridge 100 includes an upper cover unit 101, a supplementing jig 102, and a handle unit 103.

The upper cover unit 101 is installed on an upper face of the powder tank 83 instead of the foregoing upper cover 83a, when the raw material supply cartridge 100 is installed at the storage chamber 81.

The supplementing jig 102 is installed such that an opening 111 of a material bottle 100 and an opening 101a installed on the upper cover unit 101 are connected and raw material powder falls from the material bottle 110 to the powder tank 83 therethrough. The supplementing jig 102 includes a cap unit 104, a fall guide unit 105, a crease box unit 106, and a valve unit 107. The cap unit 104 is installed to be inserted into the opening 111 of the material bottle 110 at the material bottle 110 side of the supplementing jig 102. The fall guide unit 105 is installed at the upper cover unit 101 side of the cap unit 104. An upper portion of the fall guide unit 105 has a funnel-like shape having a diameter decreased toward the lower side from the upper side. Also, a cylindrical supply pipe unit 108 is installed at a lower side of the fall guide unit 105. The crease box unit 106 is installed to connect the fall guide unit 105 and the upper cover unit 101 and can be expanded and contracted in a vertical direction. Namely, the cap unit 104 and the fall guide unit 105 are connected to be relatively displaced in the vertical direction with respect to the upper cover unit 101 through the crease box unit 106.

The valve unit 107 is installed to be fixed to the upper cover unit 101 and coupled to a funnel-like portion of the fall guide unit 105. When the cap unit 104 and the fall guide unit 105 are positioned at an upper side, the fall guide unit 105 and the valve unit 107 are coupled so that the material bottle 110 and the powder tank 83 do not communicate with each other. Meanwhile, when the cap unit 104 and the fall guide unit 105 are positioned at a lower side, the fall guide unit 105 and the valve unit 107 are not coupled so that the material bottle 110 and the powder tank 83 communicate with each other.

The handle unit 103 is installed at an upper side of the upper cover unit 101 and guides and supports the material bottle 110 such that the material bottle 110 does not fall when the material bottle 110 is installed in the raw material supply cartridge 100. Also, the handle unit 103 may serve as a handle when the raw material supply cartridge 100 is moved or reversed vertically.

Further, an exhaust port 101b may be installed in the upper cover unit 101 in order to exhaust dust generated when the raw material supply cartridge 100 is installed in the storage chamber 81 and raw material powder is supplemented in the powder tank 83.

The method for supplying raw material powder from the material bottle 110 to the powder tank 83 by the foregoing raw material supply cartridge 100 may be performed, for example, as follows.

First, the opening 111 of the material bottle 110 faces upward, and in this state, a cap of the material bottle 110 is removed. And, the raw material supply cartridge 100 faces in a direction vertically opposite to the direction illustrated in FIG. 5, and in this state, the cap unit 104 of the supplementing jig 102 is inserted into the opening 111 of the material bottle 110. Then, the upper cover 83a of the powder tank 83 is removed. In a state in which the supplementing jig 102 and the material bottle 110 are integrated, they are reversed up and down such that the upper cover unit 101 covers the upper face of the powder tank 83. Here, the cap unit 104 and the fall guide unit 105 are placed at an upper position and the fall guide unit 105 and the valve unit 107 are coupled so that the material bottle 110 and the powder tank 83 do not communicate with each other.

Next, an exhaust device (not shown) such as, for example, a cleaner or the like is installed in the exhaust port 101b. And, the material bottle 110 and the supplementing jig 102 are integrally pushed downward so as to be moved to a lower position, thereby preventing the fall guide unit 105 and the valve unit 107 from being coupled and thus allowing the material bottle 110 and the powder tank 83 to communicate with each other. Accordingly, raw material powder is supplied from the material bottle 110 to the powder tank 83.

Thereafter, press-fitting of the material bottle 110 and the supplementing jig 102 is stopped, and for example, the material bottle 110 and the supplementing jig 102 are moved to an upper position by means of a spring force or the like of the crease box unit 106 to couple the fall guide unit 105 and the valve unit 107 and block communication between the material bottle 110a and the powder tank 83. And, powder which has flown up through the exhaust port 101b is extracted by the exhaust device such as, for example, a cleaner or the like. Thereafter, the raw material supply cartridge 100 is removed from the upper face of the powder tank 83, and in a state in which the supplementing jig 102 and the material bottle 110 are integrated, they are reversed up and down. The upper cover 83a is installed on the upper face of the powder tank 83. And, the cap unit 104 of the supplementing jig 102 is removed from the opening 111 of the material bottle 110, thus removing the raw material supply cartridge 100 from the material bottle 110, and the cap is installed on the opening 111 of the material bottle 110.

Next, the second vaporizer 41 will be described.

The second vaporizer 41 supplies an ODA gas to the film forming apparatus 10.

Figure 6:
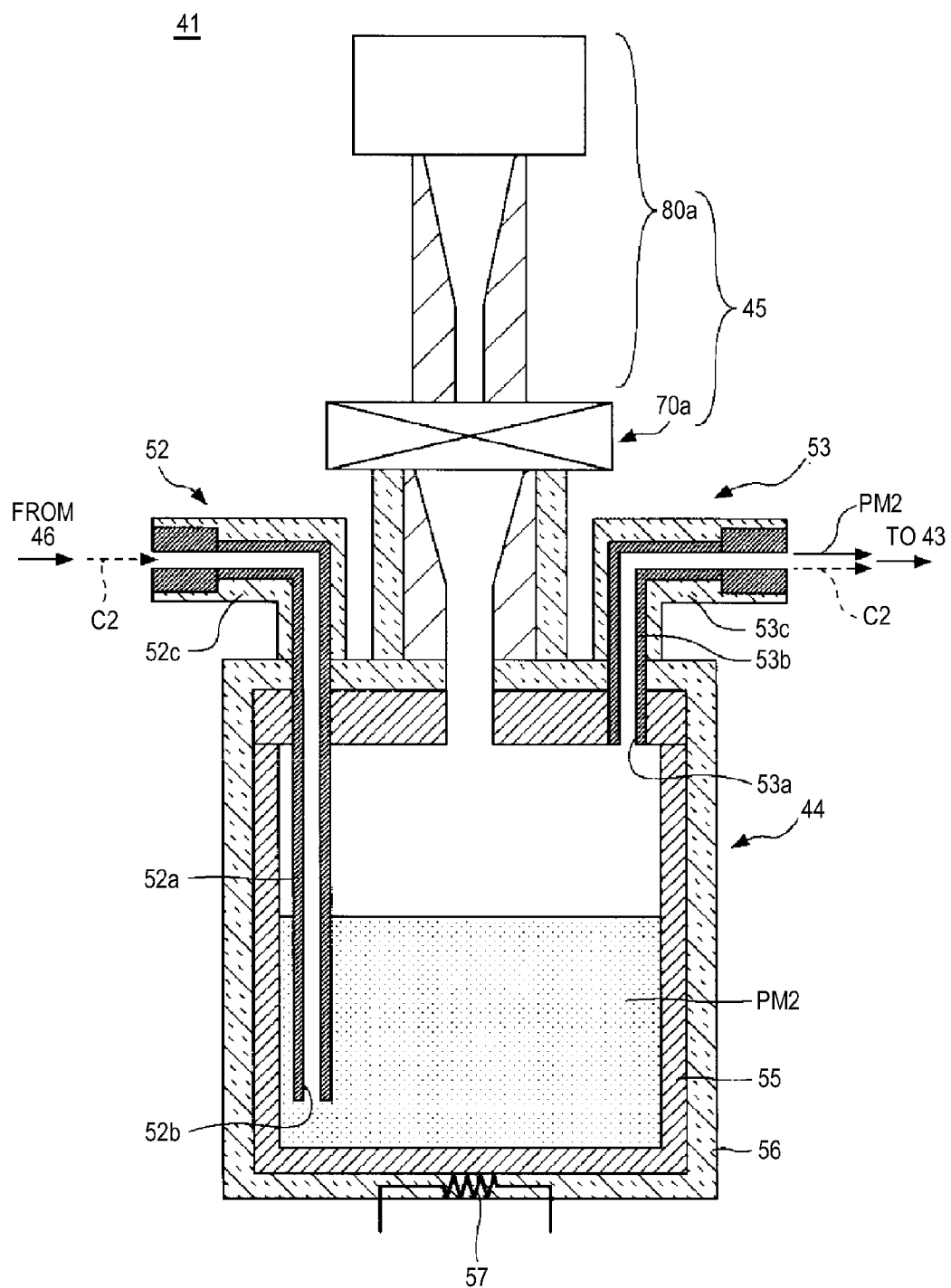
FIG. 6 is a partial vertical sectional view showing the configuration of a second vaporizer.

FIG. 6 is a partial sectional view showing the configuration of the second vaporizer 41.

The second vaporizer 41 according to the present embodiment includes a second heating unit 44, a second supply unit 45, a second gas introduction unit 52, and a second gas extraction unit 53. The second heating unit 44 is installed such that an internal pressure thereof can be adjusted, to vaporize ODA. The second supply unit 45 is installed at an upper side of the second heating unit 44 and supplies ODA to the second heating unit 44. The second gas introduction unit 52 introduces a second carrier gas C2 carrying an ODA gas vaporized from the second heating unit 44 to the second heating unit 44. The second gas extraction unit 53 extracts the vaporized ODA gas PM2 from the second heating unit 44 together with the second carrier gas C2.

The second heating unit 44 is filled with an ODA raw material in a liquid state (hereinafter, referred to as an "ODA liquid"), and has an internal space surrounded by an inner wall 55 for heating the filled ODA liquid PM2 to vaporize the same.

The second heating unit 44 is surrounded by an insulating member 56. As part of the insulating member 56, a heating mechanism 57 is installed in the vicinity of the second heating unit 44 and heats the ODA liquid filling the second heating unit 44 to vaporize the same. Further, a heater or the like may be used as the heating mechanism 57. Also, the heating mechanism 57 may only need to heat the second heating unit 44, and may be installed at a certain position of the second vaporizer 41, rather than in the vicinity of the second heating unit 44.

The second gas introduction unit 52 includes a gas introduction pipe 52a, and a gas introduction hole 52b. The gas introduction pipe 52a is a pipe for introducing the second carrier gas C2 carrying the ODA gas to the interior of the second heating unit 44 from the outside of the second heating unit 44. A gas introduction pipe 52a is installed on an upper face of the second heating unit 44 such that it penetrates the upper face of the second heating unit 44, and installed such that the interior of the second heating unit 44 extends from an upper side to a lower side. Also, one end portion of the gas introduction pipe 52a is open at a lower portion of the second heating unit 44 and the other end thereof is connected to a second carrier gas supply flow path 46 at an outer side of the second heating unit 44. The gas introduction hole 52b is an opening formed at a lower end portion of the gas introduction pipe 52a.

FIG. 6 illustrates that the gas introduction hole 52b is positioned at a lower side than a liquid face of the ODA liquid PM2 and the second carrier gas C2 supplied from the gas introduction hole 52b bubbles the ODA liquid PM2. However, the gas introduction hole 52b may be positioned higher than the liquid face of the ODA liquid PM2 and the second carrier gas C2 supplied from the gas introduction hole 52b may not bubble the ODA liquid PM2.

The gas introduction pipe 52a may be covered by the insulating member 52c. Also, a heating mechanism (not shown) may be provided at the insulating member 52c in order to introduce the second carrier gas C2 heated to have a temperature higher than room temperature to the second heating unit 44.

The second gas extraction unit 53 includes a gas extraction hole 53a and a gas extraction pipe 53b. The gas extraction pipe 53b is a pipe for extracting the ODA gas PM2 and the second carrier gas C2 from the interior of the second vaporizer 41 to outside of the second vaporizer 41. The gas extraction pipe 53b is installed on an upper face of the second heating unit 44 such that it penetrates the upper surface of the second heating unit 44. Also, the gas extraction pipe 53b is installed such that one end portion thereof is open at an internal upper portion of the second heating unit 44 and the other end thereof is connected to the second supply flow path 43 at an outer side of the second heating unit 44. The gas extraction hole 53a is an opening formed at a lower end portion of the gas extraction pipe 53b.

The gas extraction pipe 53b may be covered by an insulating member 53c. Also, a heating mechanism (not shown) may be provided at the insulating member 53c in order to extract the ODA gas PM2 and the second carrier gas C2 heated to have a temperature higher than room temperature from the second heating unit 44.

The second supply unit 45 is installed at an upper side of the second heating unit 44 and drops an ODA raw material in a solid state (hereinafter, referred to as an "ODA raw material powder") to supply the same to the second heating unit 44. The second supply unit 45 includes a partition valve unit 70a and a raw material storage unit 80a. The partition valve unit 70a is installed at an upper side of the second heating unit 44, and the raw material storage unit 80a is installed at a more upper side of the partition valve unit 70a. The second supply unit 45 in the second vaporizer 41 may have the same structure as that of the first supply unit 25 in the first vaporizer 21 and may be configured, for example, in the same manner as that of the first supply unit 25 described above with reference to FIG. 4, except that the ODA raw material powder is supplied instead of the PMDA raw material powder.

Next, an example of a film forming process using the film forming apparatus according to the present embodiment will be described with reference to FIGS. 7 through 12.

Figure 7:
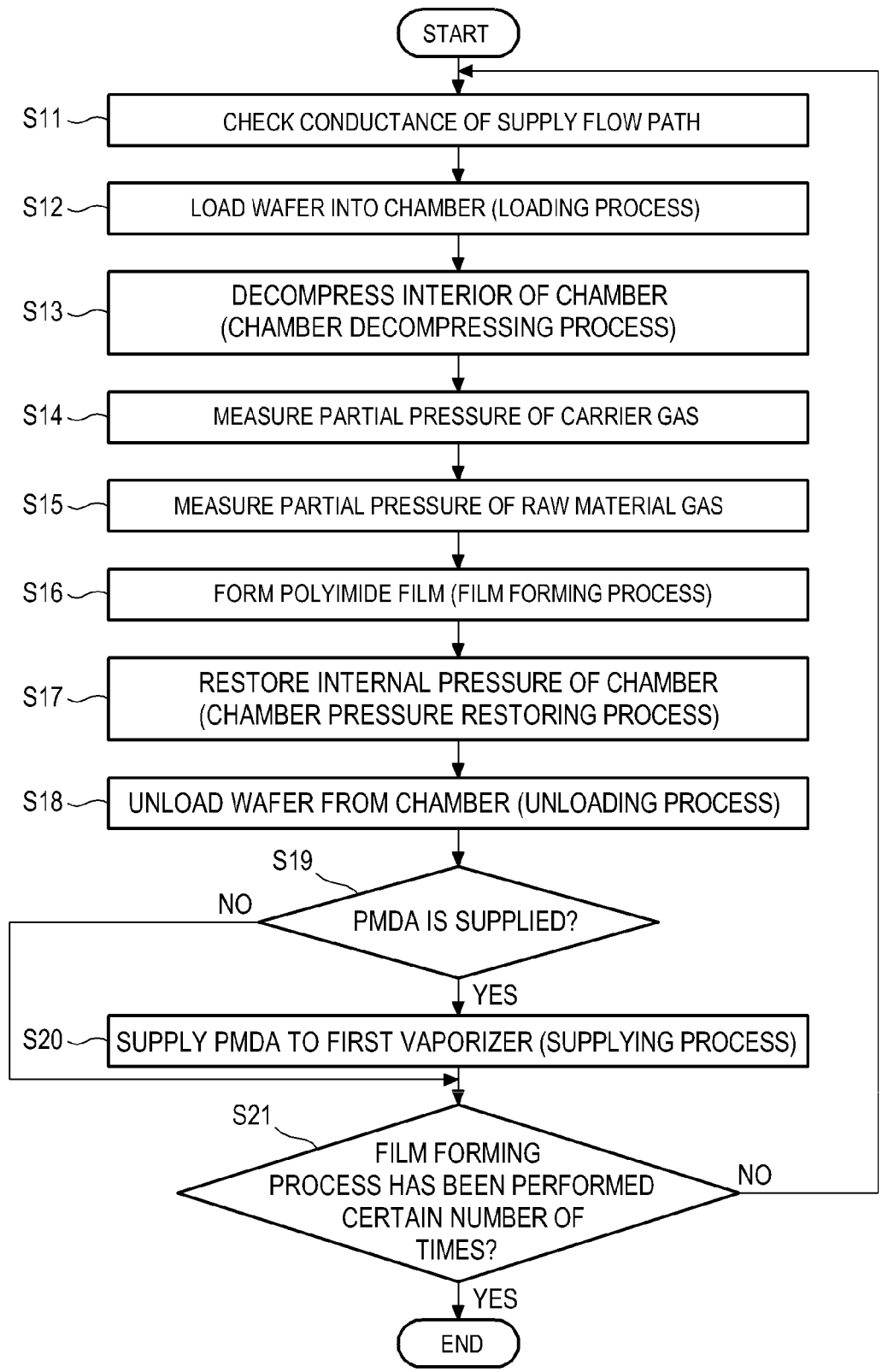
FIG. 7 is a flow chart illustrating the sequential processes including a film forming process using the film forming apparatus according to an embodiment of the present disclosure.
Figure 8:
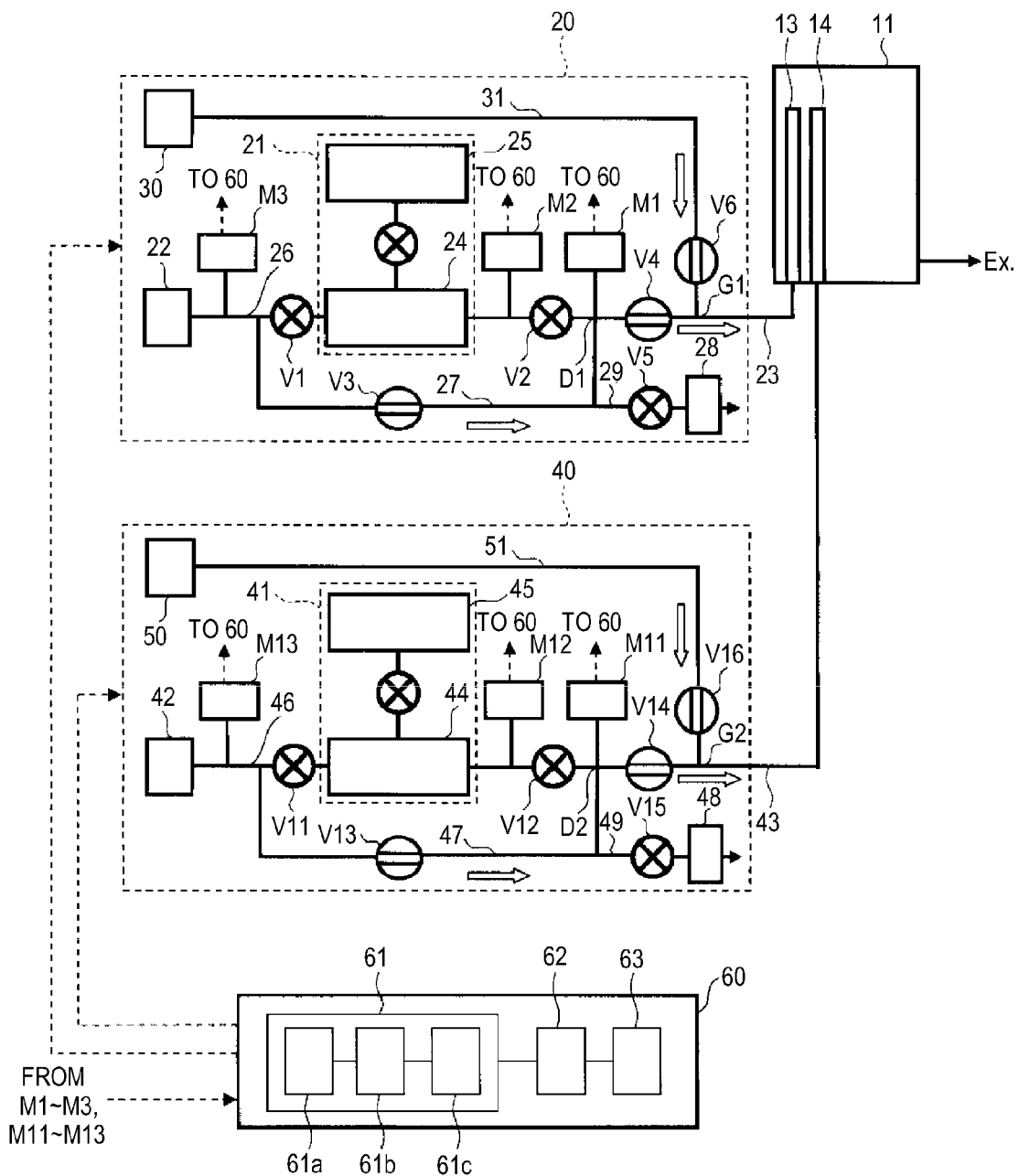
FIG. 8 is a view showing an opening and closing state of each valve of the raw material gas supply unit in step S11.
Figure 9:
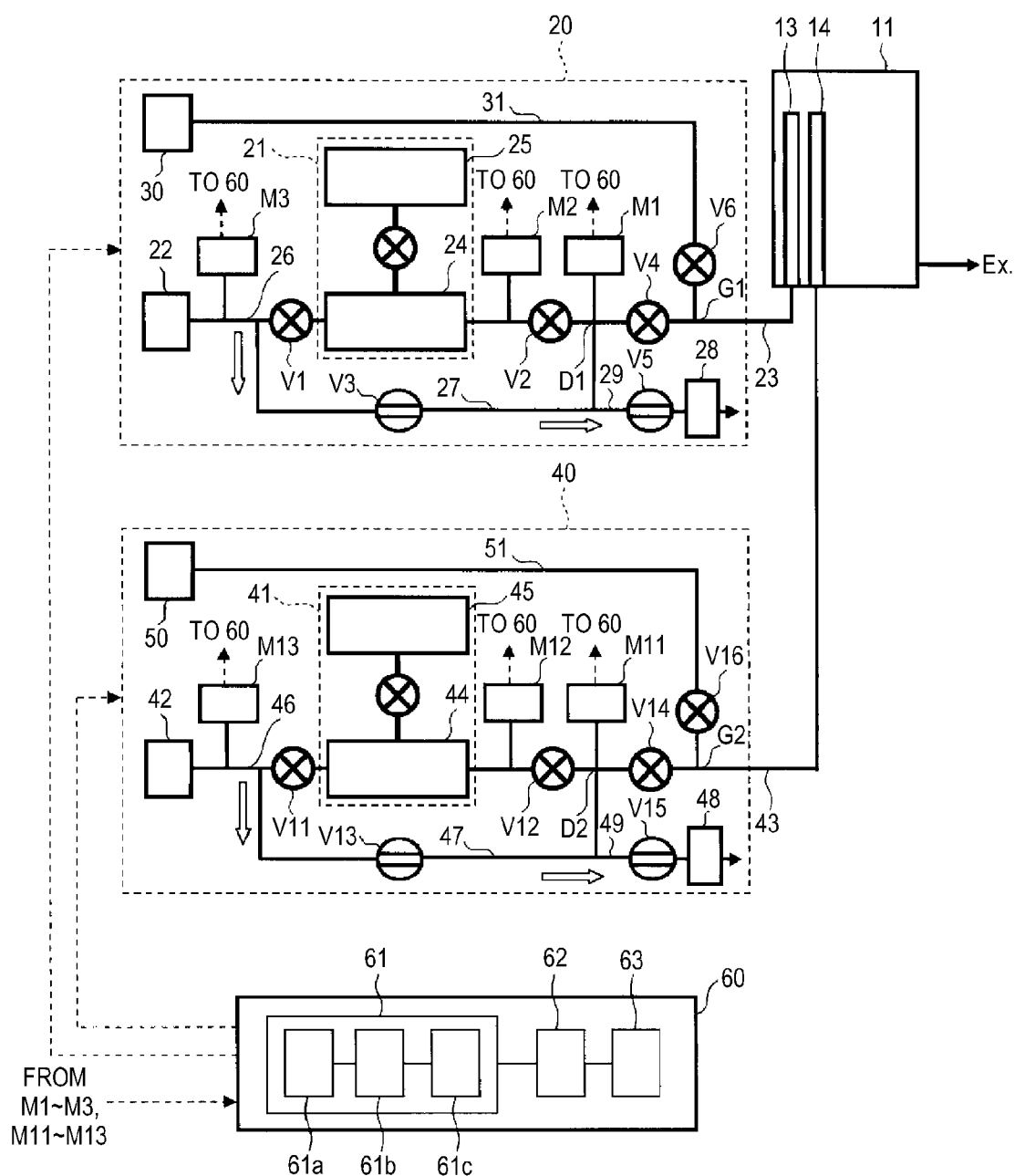
FIG. 9 is a view showing an opening and closing state of each valve of the raw material gas supply unit in step S14.
Figure 10:
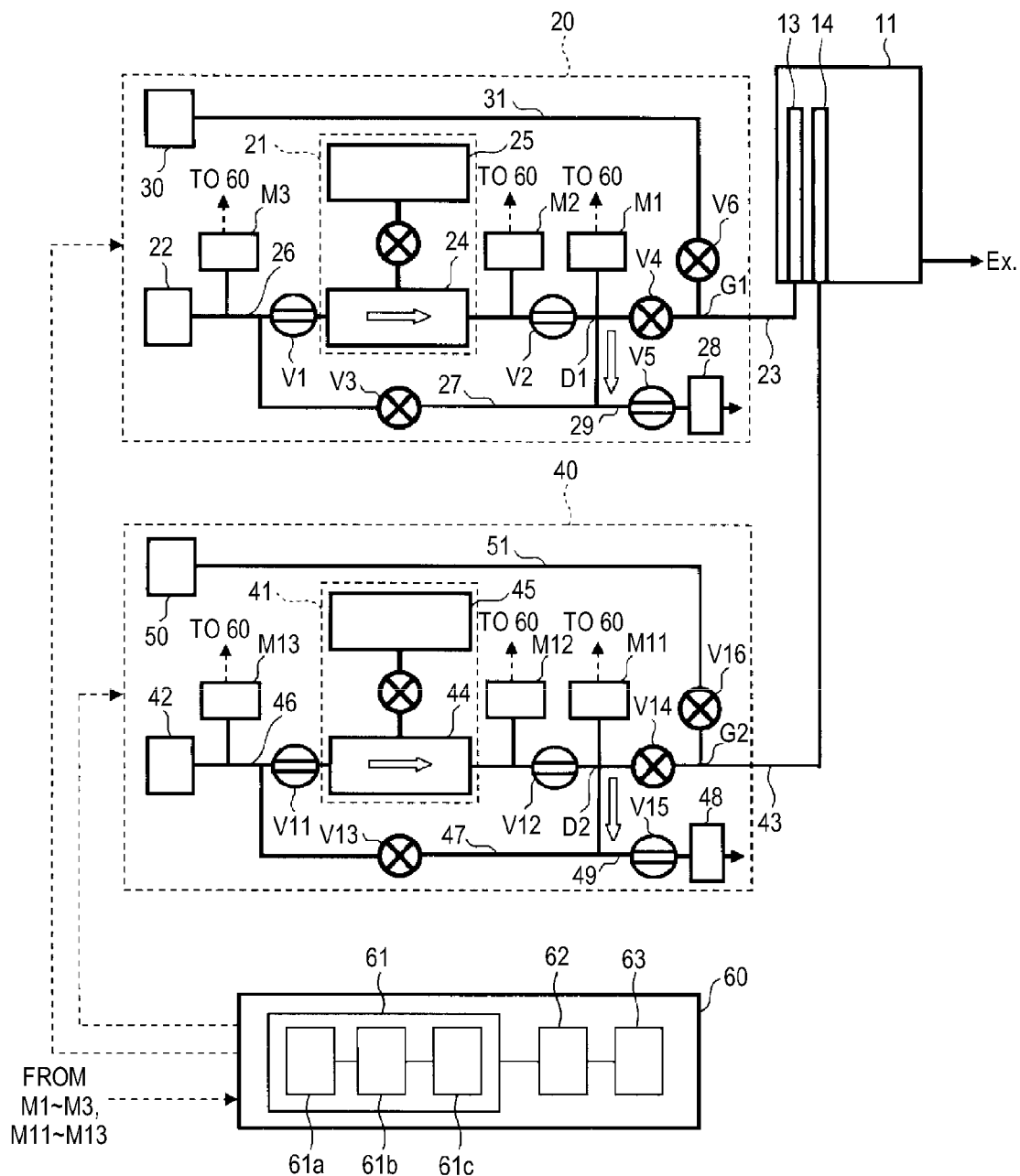
FIG. 10 is a view showing an opening and closing state of each valve of the raw material gas supply unit in step S15.
Figure 11:
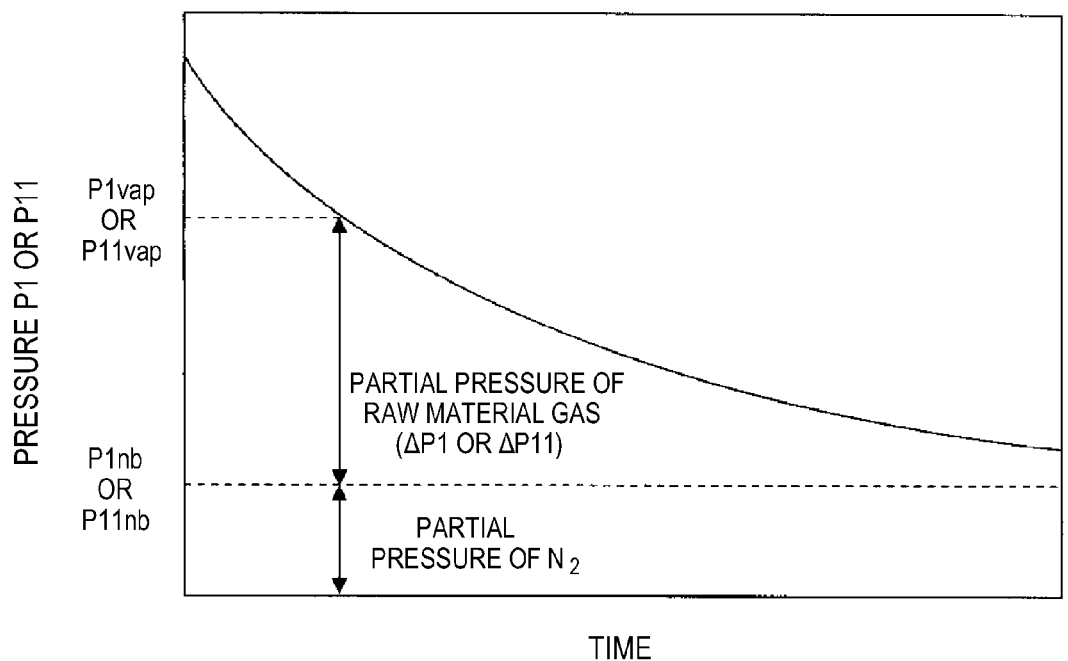
FIG. 11 is a graph schematically showing time dependency of pressure in step S15.
Figure 12:
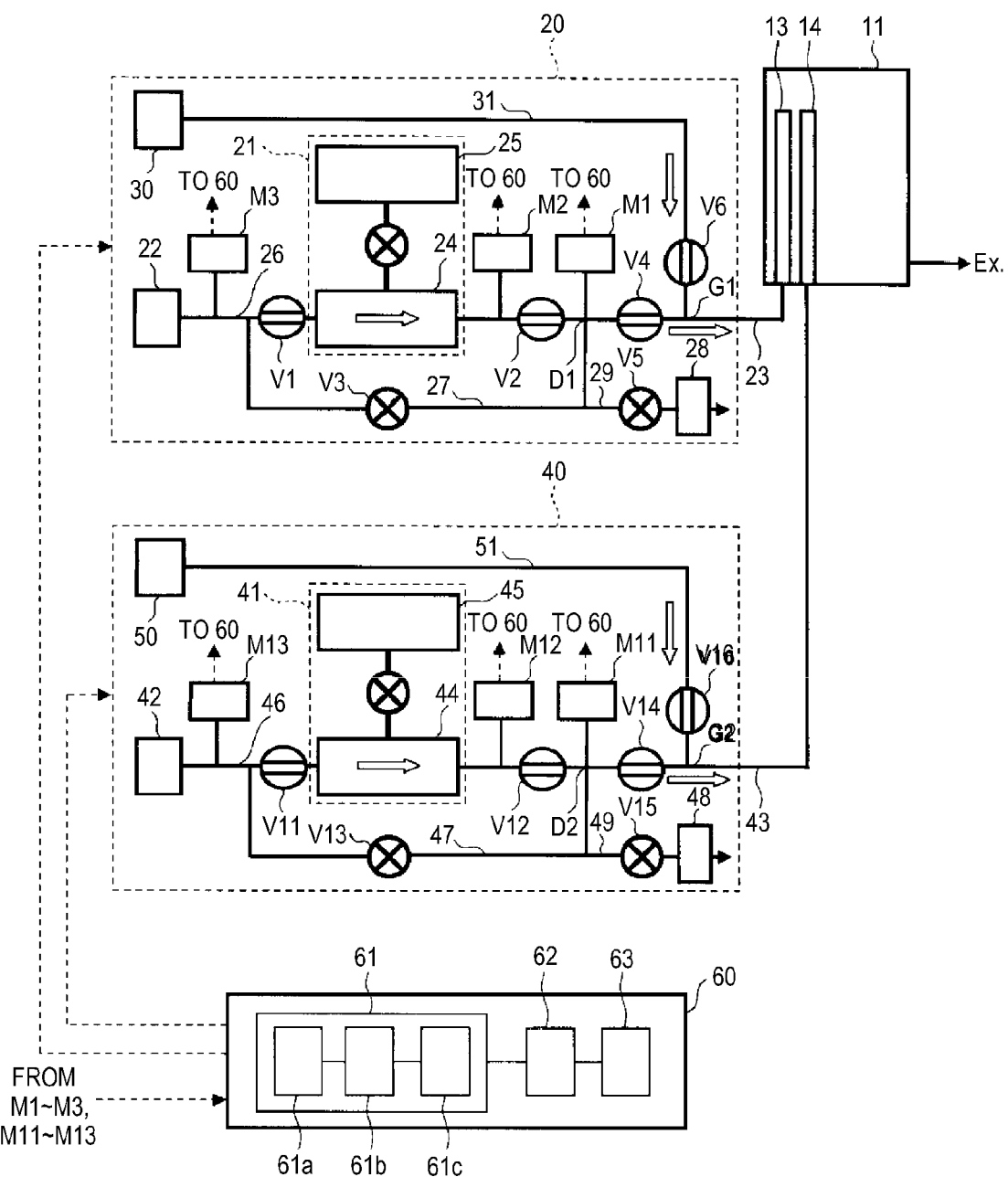
FIG. 12 is a view showing an opening and closing state of each valve of the raw material gas supply unit in step S16.

FIG. 7 is a flow chart illustrating the sequential processes including a film forming process using the film forming apparatus according to the present embodiment. FIG. 8 is a view showing an opening and closing state of each valve of the raw material gas supply units 20 and 40 in step S11. FIG. 9 is a view showing an opening and closing state of each valve of the raw material gas supply units 20 and 40 in step S14. FIG. 10 is a view showing an opening and closing state of each valve of the raw material gas supply units 20 and 40 in step S15. FIG. 11 is a graph schematically showing time dependency of pressure in step S15. FIG. 12 is a view showing an opening and closing state of each valve of the raw material gas supply units 20 and 40 in step S16.

In step S11, the conductance of each supply flow path of the film forming apparatus is checked in advance.

As shown in FIG. 8, in the first raw material gas supply unit 20, in a state in which the valves V1, V2, and V5 are closed, the valves V3 and V4 are open to connect the first carrier gas supply unit 22 to the chamber 11. In this state, the first carrier gas is supplied, by bypassing the first vaporizer 21, to the chamber 11 using the first carrier gas supply unit 22. And, it is detected whether or not the conductance of the first carrier gas supply flow path 26 and the first supply flow path 23 is within a certain range by comparing the pressure P1 measured by the first manometer M1 with previously prepared reference data.

Similarly, in the second raw gas supply unit 40, in a state in which the valves V11, V12, and V15 are closed, the valves V13 and V14 are open to connect the second carrier gas supply unit 42 to the chamber 11. In this state, the second carrier gas is supplied, by bypassing the second vaporizer 41, to the chamber 11 using the second carrier gas supply unit 42. And, it is detected whether or not the conductance of the second carrier gas supply flow path 46 and the second supply flow path 43 is within a certain range by comparing the pressure P11 measured by the second manometer M11 with previously prepared reference data.

Also, as shown in FIG. 8, in the first raw material gas supply unit 20, the valve V6 may be open to supply a flow rate adjustment gas to the chamber 11 by the first adjustment gas supply unit 30. Similarly, in the second raw material gas supply unit 40, the valve V16 may be open to supply a flow rate adjustment gas to the chamber 11 by the second adjustment gas supply unit 50. Also, when the conductance is not within a certain range, an alarm may be generated by an alarm generation unit 61c. And, in step S11, when an alarm is generated, a follow-up film forming process may be stopped and a maintenance operation may be performed.

Then, in step S12, the wafer W is loaded into the chamber 11 (a loading process). In the example of the film forming apparatus 10 illustrated in FIG. 1, for example, the wafer boat 12 may be lowered to a lower outer side of the chamber 11, the wafer W may be loaded on the lowered wafer boat 12, and the wafer boat 12 with the wafer W loaded thereon may be again lifted and inserted into the chamber 11, thereby loading the wafer W.

Next, in step S13, the interior of the chamber 11 is decompressed (a chamber decompressing process). An exhaust speed of exhausting the chamber 11 is increased by adjusting an exhaust capability of an exhaust mechanism (not shown) connected to the exhaust 15 or the degree of opening of a flow rate adjustment valve (not shown) installed between the exhaust mechanism and the exhaust 15. Also, the interior of the chamber 11 is decompressed to a certain pressure, for example, from atmospheric pressure (760 Torr), to, for example, 0.1 Torr.

Next, in step S14, a partial pressure of the carrier gas is measured.

As shown in the example of FIG. 9, in the first raw material gas supply unit 20, the valves V3 and V5 are opened in a state in which the valves V1, V2, and V4 are closed to connect the first carrier gas supply unit 22 to the first discharge unit 28 through the first bypass flow path 27. In this state, the first carrier gas from the first carrier gas supply unit 22 is discharged, by bypassing the first vaporizer 21 using the first discharge unit 28, and the pressure P1 is measured by the first manometer M1. When the measured pressure is P1$nb$, the pressure P1$nb$ is equal to the partial pressure of the first carrier gas.

Similarly, in the second raw material gas supply unit 40, the valves V13 and V15 are open in a state in which the valves V11, V12, and V14 are closed to connect the second carrier gas supply unit 42 to the second discharge unit 48 through the second bypass flow path 47. In this state, the second carrier gas from the second carrier gas supply unit 42 is discharged, by bypassing the second vaporizer 41 using the second discharge unit 48, and the pressure P11 is measured by the second manometer M11. When the measured pressure is P11$nb$, the pressure P11$nb$ is equal to the partial pressure of the second carrier gas.

Next, in step S15, a partial pressure of the raw material gas is measured.

The temperature of the first heating unit 24 of the first vaporizer 21 is adjusted to be a certain temperature, e.g., 260 degrees C., and the pressure of the first heating unit 24 is adjusted to be a certain pressure and maintained for a certain period of time in advance. The certain pressure may be, for example, atmospheric pressure (760 Torr) or may be a pressure lower than the atmospheric pressure (decompressed) (which is the same as a "certain pressure" hereinafter). And, as shown in the example of FIG. 10, in the first raw material gas supply unit 20, in a state in which the valve V4 is closed and the valve V5 is open, the valve V3 is closed and the valves V1 and V2 are open to connect the first carrier gas supply unit 22 and the first vaporizer 21 to the first discharge unit 28. In this state, the first carrier gas from the first carrier gas supply unit 22 is exhausted through the first vaporizer 21 using the first discharge unit 28 and the pressure P1 is measured by the first manometer M1.

As shown in the example of FIG. 11, after the measurement is initiated, the pressure of the first heating unit 24 is gradually reduced from the certain pressure. For example, when the pressure P1 measured after the lapse of the certain time is P1$vap$, the pressure P1$vap$ is equal to the sum of the partial pressure of the PMDA gas and that of the first carrier gas. Thus, the partial pressure $\Delta P1$ of the PMDA gas can be calculated by $\Delta P1 = P1vap - P1nb$.

And then, the measured partial pressure $\Delta P1$ of the PMDA gas is compared with previously prepared reference data to detect whether or not the partial pressure $\Delta P1$ of the PMDA gas is within a certain range. Also, when the partial pressure $\Delta P1$ of the PMDA gas is not within the certain range, an alarm may be generated by the alarm generation unit 61c. And, in step S15, when an alarm is generated, a follow-up film forming process may be stopped and a maintenance operation may be performed.

Similarly, the temperature of the second heating unit 44 of the second vaporizer 41 is adjusted to be a certain temperature, e.g., 220 degrees C., and the pressure of the second heating unit 44 is adjusted to be a certain pressure, for example, atmospheric pressure (760 Torr) and maintained for a certain period of time. And, as shown in the example of FIG. 10, also in the second raw material gas supply unit 40, in a state in which the valve V14 is closed and the valve V15 is open, the valve V13 is closed and the valves V11 and V12 are open to connect the second carrier gas supply unit 42 and the second vaporizer 41 to the second discharge unit 48. In this state, the second carrier gas from the second carrier gas supply unit 42 is exhausted by bypassing the second vaporizer 41 using the second discharge unit 48 and the pressure P11 is measured by the second manometer M11.

As shown in the example of FIG. 11, after the measurement is initiated, the pressure of the second heating unit 44 is gradually reduced from the certain pressure. For example, when the pressure P11 measured after the lapse of the certain time is P11vap, the pressure P11vap is equal to the sum of the partial pressure of the ODA gas and that of the second carrier gas. Thus, the partial pressure ΔP11 of the ODA gas can be calculated by ΔP11=P11vap−P11nb.

And then, the measured partial pressure ΔP11 of the ODA gas is compared with previously prepared reference data to detect whether or not the partial pressure ΔP11 of the ODA gas is within a certain range. Also, when the partial pressure ΔP11 of the ODA gas is not within the certain range, an alarm may be generated by the alarm generation unit 61c. And, in step S15, when an alarm is generated, a follow-up film forming process may be stopped and a maintenance operation may be performed.

Next, in step S16, a polyimide film is formed (a film forming process). As shown in the example of FIG. 12, in a state in which the valve V3 is closed and the valves V1 and V2 are open, the valve V5 is closed and the valve V4 is open to connect the first carrier gas supply unit 22 and the first vaporizer 21 to the chamber 11. In this state, the PMDA gas and the first carrier gas are supplied to the chamber 11 by the first raw material supply unit 20. Also, as shown in the example of FIG. 12, in a state in which the valve V13 is closed and the valves V11 and V12 are open, the valve V15 is closed and the valve V14 is open to connect the second carrier gas supply unit 42 and the second vaporizer 41 to the chamber 11. In this state, the ODA gas and the second carrier gas are supplied to the chamber 11 by the second raw gas supply unit 40. And, PMDA and ODA are polymerized on the surface of the wafer W to form a polyimide film.

Here, the polarization of PMDA and ODA follows Chemical formula 2 shown below:

Chemical formula 2

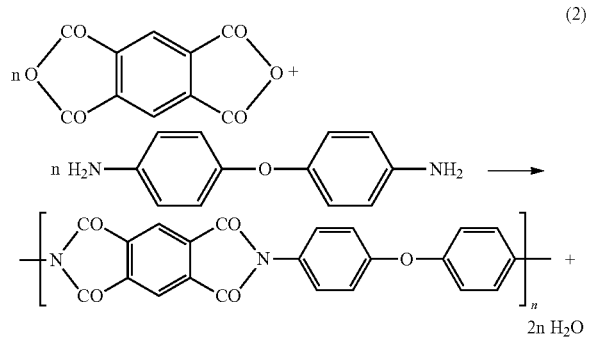

(2)

As shown in FIG. 12, in the first raw material gas supply unit 20, the valve V6 may be open to supply a flow rate adjustment gas to the chamber 11 by the first adjustment gas supply unit 30. For example, the flow rate of the first carrier gas may be determined to be 50 sccm, and the flow rate of the flow rate adjustment gas may be determined to be 850 sccm.

Also, as shown in FIG. 12, in the second raw material gas supply unit 40, the valve V16 may be open to supply a flow rate adjustment gas to the chamber 11 by the second adjustment gas supply unit 50. For example, the flow rate of the second carrier gas may be determined to be 700 sccm, and the flow rate of the flow rate adjustment gas may be determined to be 200 sccm.

Temperature and pressure of the first vaporizer 21 and those of the second vaporizer 41 in the film formation can be explained with reference to FIGS. 13 and 14.

Figure 13:
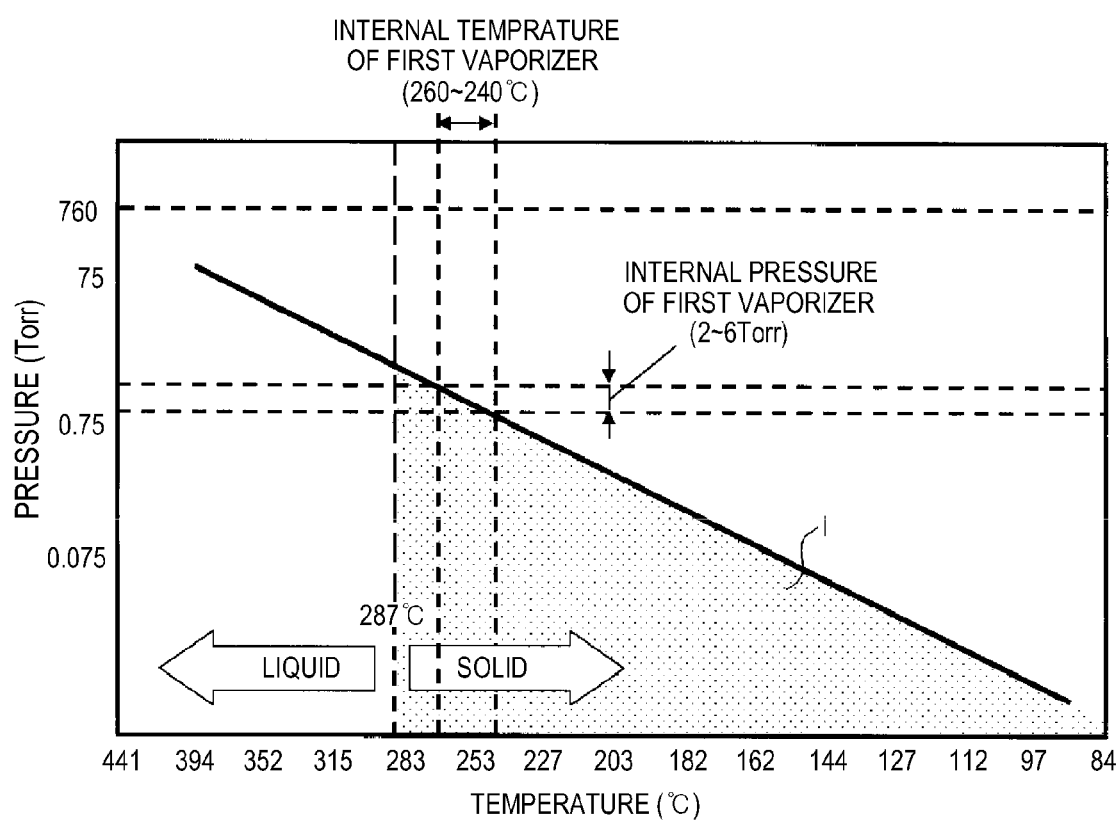
FIG. 13 is a graph schematically showing vapor pressure curves of PMDA.

FIG. 13 is a graph schematically showing a vapor pressure curve of PMDA. In FIG. 13, the horizontal axis denotes temperature such that the reciprocal 1/T of an absolute temperature T has a linear scale, and the vertical axis denotes pressure such that a log of pressure has a linear scale. Then, the vapor pressure curve of PMDA is substantially linear within a certain range. Also, the temperature of liquefaction at atmospheric pressure (760 Torr) of PMDA is 287 degrees C. Thus, in order for the first heating unit 24 to heat the PMDA raw material in the solid state (PMDA raw material powder) to vaporize the same, in some embodiments, the temperature is 287 degrees C. or lower, and the pressure is equal to or lower than the pressure on the vapor pressure curve at that temperature. Namely, in some embodiments, the first vaporizer 21 is controlled such that the internal temperature and pressure thereof are included in the shaded area I in FIG. 13. Also, in order to increase a supply amount of the PMDA gas, in some embodiments, the first vaporizer 21 is controlled such that the internal temperature and pressure thereof are included in an area in which the pressure is as high as possible as a part of the area I.

Figure 14:
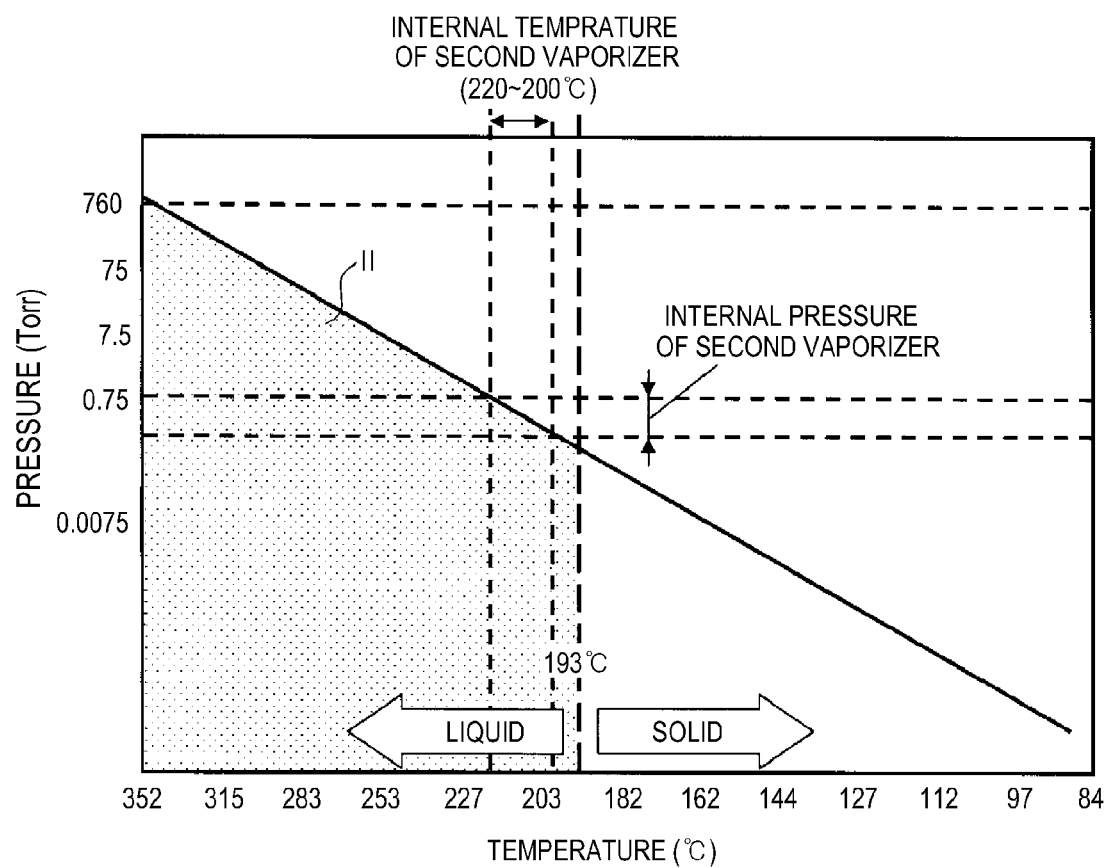
FIG. 14 is a graph schematically showing vapor pressure curves of ODA.

FIG. 14 is a graph schematically showing a vapor pressure curve of ODA. In FIG. 14, the horizontal axis denotes temperature such that the reciprocal 1/T of an absolute temperature T has a linear scale, and the vertical axis denotes pressure such that a log of pressure (partial pressure) has a linear scale. Then, the vapor pressure curve of ODA is substantially linear within a certain range. Also, the temperature of liquefaction at atmospheric pressure (760 Torr) of ODA is 193 degrees C. Thus, in order for the second heating unit 44 to heat the ODA raw material in the liquid state (ODA raw material powder) to vaporize the same, in some embodiments, the temperature is 193 degrees C. or greater and the pressure is equal to or lower than the pressure on the vapor pressure curve at that temperature. Namely, in some embodiments, the second vaporizer 41 is controlled such that the internal temperature and pressure of the second vaporizer 41 are included in the shaded area II in FIG. 14. Also, in order to increase a supply amount of the ODA gas, in some embodiments, the second vaporizer 41 is controlled such that the internal temperature and pressure thereof are included in an area in which the pressure is as high as possible as a part of the area II.

Also, in order to supply the PMDA gas vaporized in the first vaporizer 21 and the ODA gas vaporized in the second vaporizer 41 to the chamber 11 to polymerize them, in some embodiments, the temperature and pressure of the first vaporizer 21 and those of the second vaporizer 41 are as close as possible. In consideration of such conditions, the temperature and pressure of the first heating unit 24 and the second heating unit 44 may be determined.

As shown in FIG. 13, in some embodiments, the internal temperature of the first vaporizer 21 ranges, for example, from 240 to 260 degrees C., and in some instances, the internal pressure of the first vaporizer 21 ranges from 2 to 6 Torr, which is the pressure on the vapor pressure curve corresponding to that temperature area. Also, as shown in FIG. 14, in some embodiments, the internal temperature of the second vaporizer 41 ranges, for example, from 200 to 220 degrees C., and in some instances, the internal pressure of the second vaporizer 41 ranges from 0.5 to 1.2 Torr, which is the pressure on the vapor pressure curve corresponding to that temperature area.

Meanwhile, the flow rate F1 of PMDA monomer required for the film forming process is calculated, for example, as follows. Here, it is assumed that, for example, 25 sheets of wafers having a diameter of 300 mmΦ are collectively processed to form a polyimide film having a thickness of 1 μm.

Then, the amount of the PMDA raw material powder required for a film formation and the flow rate of the PMDA monomer required therefor are calculated, for example, as follows:

The area S of wafer is represented by Eq. (3):

$$S = \pi \times 15 \text{cm} \times 15 \text{cm} = 707 \text{cm}^2 \quad \text{Eq. (3)}$$

The volume V of the polyimide film is represented by Eq. (4):

$$V = S \times 1 \times 10^{-4} = 7.07 \times 10^{-2} \text{cm}^3 \quad \text{Eq. (4)}$$

Further, when the density of polyimide is set to 1.42 g/cm³, the mass w0 of polyimide required for a film formation per one sheet of wafer is represented by Eq. (5):

$$w0 = V \times 1.42 = 0.100 \text{ g} \quad \text{Eq. (5)}$$

In addition, when it is assumed that the PMDA monomer (molecular weight: 218) and ODA monomer (molecular weight: 200) in the polyimide film are mixed substantially in an equal mol ratio, the mass required for each monomer is about w0/2. Also, when it is assumed that 25 sheets of wafers are collectively processed to form a film and 10% of the supplied PMDA monomer is used for the film formation, the mass w1 of the PMDA monomer required for the film formation one time is as follows.

$$w1 = w0/2 \times 25/(10/100) = 12.5 \text{ g} \quad \text{Eq. (6)}$$

When a film formation time duration t is 10 minutes, the flow rate F1 of the PMDA gas supplied from the first vaporizer 21 is as follows.

$$F1 = w1/t = 12.5 \text{ g}/10 \text{ mins} = 1.25 \text{ g/mins}$$

Figure 15:
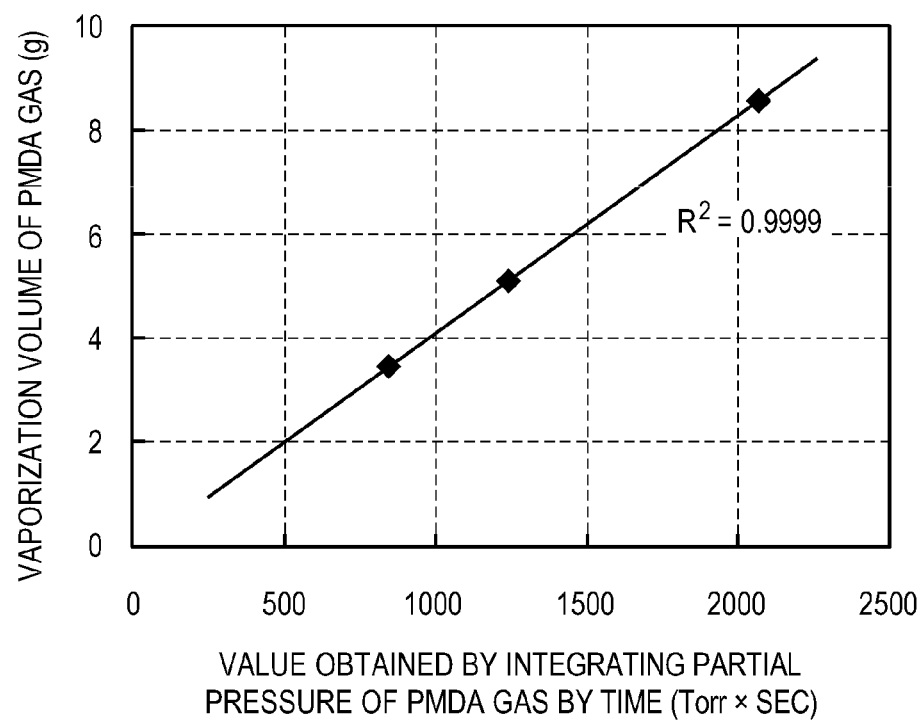
FIG. 15 is a graph showing an example of experiment results illustrating a relationship between a value obtained by integrating partial pressures of PMDA gas by time and a vaporization volume of the PMDA gas.

FIG. 15 is a graph showing an example of experiment results illustrating a relationship between a value obtained by integrating a partial pressure of the PMDA gas by time and a vaporization volume of the PMDA gas. As shown in FIG. 15, the vaporization volume of the PMDA gas is proportional to the value obtained by integrating the partial pressure of the PMDA gas by time. Accordingly, the flow rate F1 of the PMDA gas is proportional to the partial pressure $\Delta P1$ of the foregoing PMDA gas. Thus, the mass of the PMDA monomer supplied to the wafer W in the film formation process can be adjusted to a certain value by adjusting the partial pressure $\Delta P1$ of the PMDA gas to a certain value.

Figure 16:
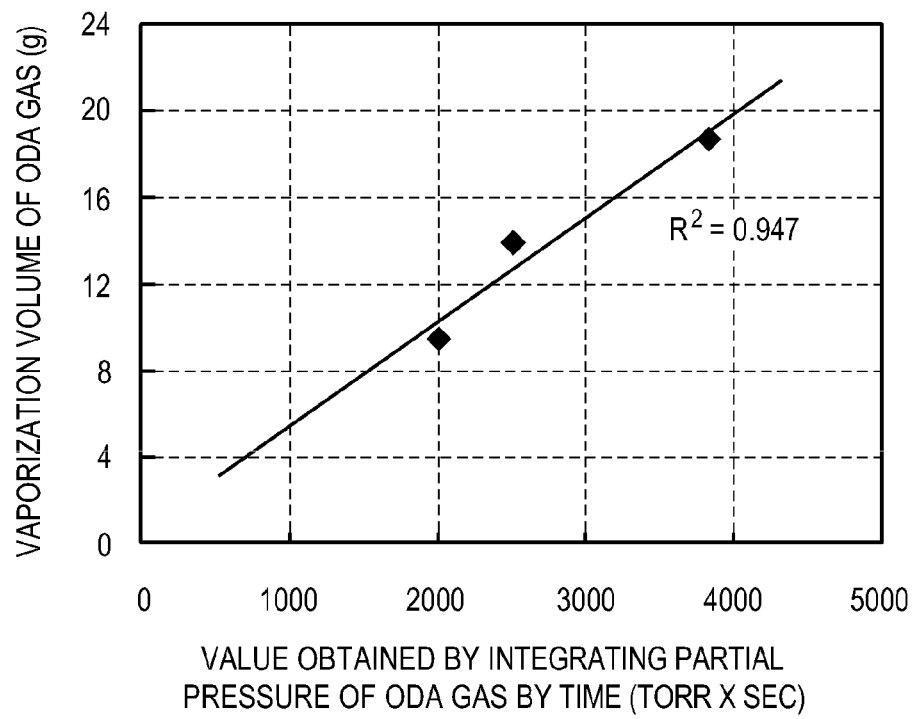
FIG. 16 is a graph showing an example of experiment results illustrating a relationship between a value obtained by integrating partial pressures of ODA gas by time and a vaporization volume of the ODA gas.

FIG. 16 is a graph showing an example of experiment results illustrating a relationship between a value obtained by integrating a partial pressure of the ODA gas by time and a vaporization volume of the ODA gas. As shown in FIG. 16, the vaporization volume of the ODA gas is proportional to the value obtained by integrating the partial pressure of the ODA gas by time. Accordingly, the flow rate F2 of the ODA gas is proportional to the partial pressure $\Delta P11$ of the foregoing ODA gas. Thus, the mass of the ODA monomer supplied to the wafer W in the film formation process can be adjusted to a certain value by adjusting the partial pressure $\Delta P11$ of the ODA gas to a certain value.

In the present embodiment, in some instances, the third manometer M2 is installed in the first raw material gas supply unit 20. Accordingly, it can be detected whether or not the vaporization volume of the PMDA gas is within a certain range and whether or not the conductance of the first supply flow path 23 is within a certain range based on the pressure P1 measured by the first manometer M1 and the pressure P2 measured by the third manometer M2.

For example, when the vaporization volume of the PMDA gas is 100 sccm and the flow rate of the first carrier gas is 50 sccm, a pressure difference between the pressure P1 and the pressure P2 may be determined to be 2 Torr. Here, it is assumed that the vaporization volume of the PMDA gas is increased by 10% and reaches 110 sccm. Then, the pressure difference between the pressure P1 and the pressure P2 is increased by 0.17 Torr and reaches 2.17 Torr. Also, it is assumed that resolving power of the first manometer M1 is 0.01 Torr and a deviation of measurement values in a state in which pressure is stabilized is 0.03 Ton. Then, a variation of about ±10% in the vaporization volume of the PMDA gas can be detected by using the manometers M1 and M2.

Similarly, in the present embodiment, in some instances, the fourth manometer M12 is installed in the second raw material gas supply unit 40. Accordingly, it can be detected whether or not the vaporization volume of the ODA gas is within a certain range and whether or not the conductance of the second supply flow path 43 is within a certain range based on the pressure P11 measured by the second manometer M11 and the pressure P12 measured by the fourth manometer M12. Further, a variation of about ±10% in the vaporization volume of the ODA gas can also be detected by using the manometers M1 and M2.

Also, in the present embodiment, in some embodiments, the fifth manometer M3 is installed in the first raw material gas supply unit 20. Accordingly, it can be detected whether or not the vaporization volume of the PMDA gas is within a certain range and whether or not the conductance of the first vaporizer 21 is within a certain range based on the pressure P1 measured by the first manometer M1 and the pressure P3 measured by the fifth manometer M3.

Also, in the present embodiment, in some embodiments, the sixth manometer M13 is installed in the second raw material gas supply unit 40. Accordingly, it can be detected whether or not the vaporization volume of the ODA gas is within a certain range and whether or not the conductance of the second vaporizer 41 is within a certain range based on the pressure P11 measured by the second manometer M11 and the pressure P13 measured by the sixth manometer M13.

Here, whether or not the vaporization volume of each raw material gas and the conductance of each supply flow path are within a certain range may be detected by detecting whether or not each pressure is within a certain range by comparing the pressure measured by each manometer with the previously prepared reference data. And, when each pressure is not within the certain range, an alarm may be generated by the alarm generation unit 61c. Also, in step S16, although an alarm is generated, the film formation process may not be stopped, the generation of the alarm may be recorded, the film formation process in progress may be performed to completion, and then, a maintenance operation may be performed.

After step S16 (a film formation process), in step S17, the valves V1, V2, and V4 are closed to restore the pressure of the first heating unit 24 of the first vaporizer 21 to a certain pressure, e.g., the atmospheric pressure (760 Torr). Also, the valves V11, V12, and V14 are closed to restore the pressure of the second heating unit 44 of the second vaporizer 41 to a certain pressure, e.g., the atmospheric pressure (760 Torr). And, the interior of the chamber 11 is restored to atmospheric pressure (a chamber pressure restoration process). An exhaust speed of exhausting the chamber 11 is reduced by adjusting an exhaust capability of an exhaust mechanism (not shown) connected to the exhaust 15 or the degree of opening of a flow rate adjustment valve (not shown) installed between the exhaust mechanism and the exhaust 15. And, the interior of the chamber 11 is restored from, for example, 0.1 Torr to, for example, atmospheric pressure (760 Torr).

Next, in step S18, the wafer W is unloaded from the chamber 11 (an unloading process). In the example of the film forming apparatus 10 illustrated in FIG. 1, for example, the wafer boat 12 may be lowered to a lower outer side of the chamber 11, the wafer W may be removed from the lowered wafer boat 12, and the wafer boat 12 without the wafer W is lifted again so as to be inserted into the chamber 11, thus unloading the wafer W.

Subsequently, in step S19, whether to supply PMDA is determined For example, it may be determined whether or not a certain number of film formation processes have been performed from the supply of a previous session, whether or not a certain time has lapsed from the supply of the previous session, or the like. When it is determined that the PMDA raw material powder is to be supplied, the process proceeds to step 20, and when it is determined that the PMDA raw material powder may not need to be supplied, the process proceeds to step S21.

In step S20, PMDA is supplied to the first vaporizer 21 (a supply process). A diffusion preventing gas is supplied from the diffusion preventing gas supply hole 87 and the supplied diffusion preventing gas is discharged from the diffusion preventing gas extraction hole 92, and in this state, the partition valve 72 of the partition valve unit 70 is open. And, a certain supply amount of the PMDA raw material powder is dropped to be supplied a certain number of times from the powder tank 83 to the upper raw material supply pipe 82 by the piston type supply mechanism 86, thereby supplying the PMDA raw material powder from the storage chamber 81 to the first heating unit 24.

Next, in step S21, it is determined whether or not the film formation process has been performed a certain number of times. When the film formation process has been performed the certain number of times, the film formation process is terminated. When the film formation process has not been performed the certain number of times, the process returns to step S11.

In the present embodiment, the PMDA gas, which has been vaporized, can be prevented from being diffused to the storage chamber 81 from the first heating unit 24 by the diffusion preventing mechanism 90, and a supply amount of the PMDA raw material powder supplied from the storage chamber 81 to the first heating unit 24 by the piston type supply mechanism 86 can be adjusted with a high level of precision.

Also, in the present embodiment, a description of an ODA determination process of determining whether to supply ODA and an ODA supply process of supplying ODA to the second vaporizer 41 is omitted. However, the ODA determination process and the ODA supply process may be performed in the same manner as the process of determining whether to supply PMDA and the process of supplying PMDA.

As described above, in the present embodiment, a polyimide film formed by polymerizing the raw material gas can be continuously stably formed by preventing a change in the supply amount of the raw material gas.

Also, as described above, even when the film forming apparatus processing each sheet, instead of the film forming apparatus performing batch processing, is used, it can continuously stably form a polyimide film, which is formed by polymerizing PMDA and ODA, by preventing a change in the supply amount of the PMDA gas and the ODA gas.

Further, in the present embodiment, the first bypass flow path 27, the first adjustment gas supply unit 30, the first adjustment gas supply flow path 31 may be omitted. In addition, the second bypass flow path 47, the second adjustment gas supply unit 50, the second adjustment gas supply flow path 51 may be omitted.

First Modification of Embodiment

A film forming apparatus according to a first modification of an embodiment of the present disclosure will now be described with reference to FIG. 17.

The film forming apparatus according to this modification is different from the film forming apparatus according to the present embodiment, in that the manometers M3 and M13 are not installed. Other parts are the same as those of the film forming apparatus according to the present embodiment, so a description thereof will be omitted.

Figure 17:
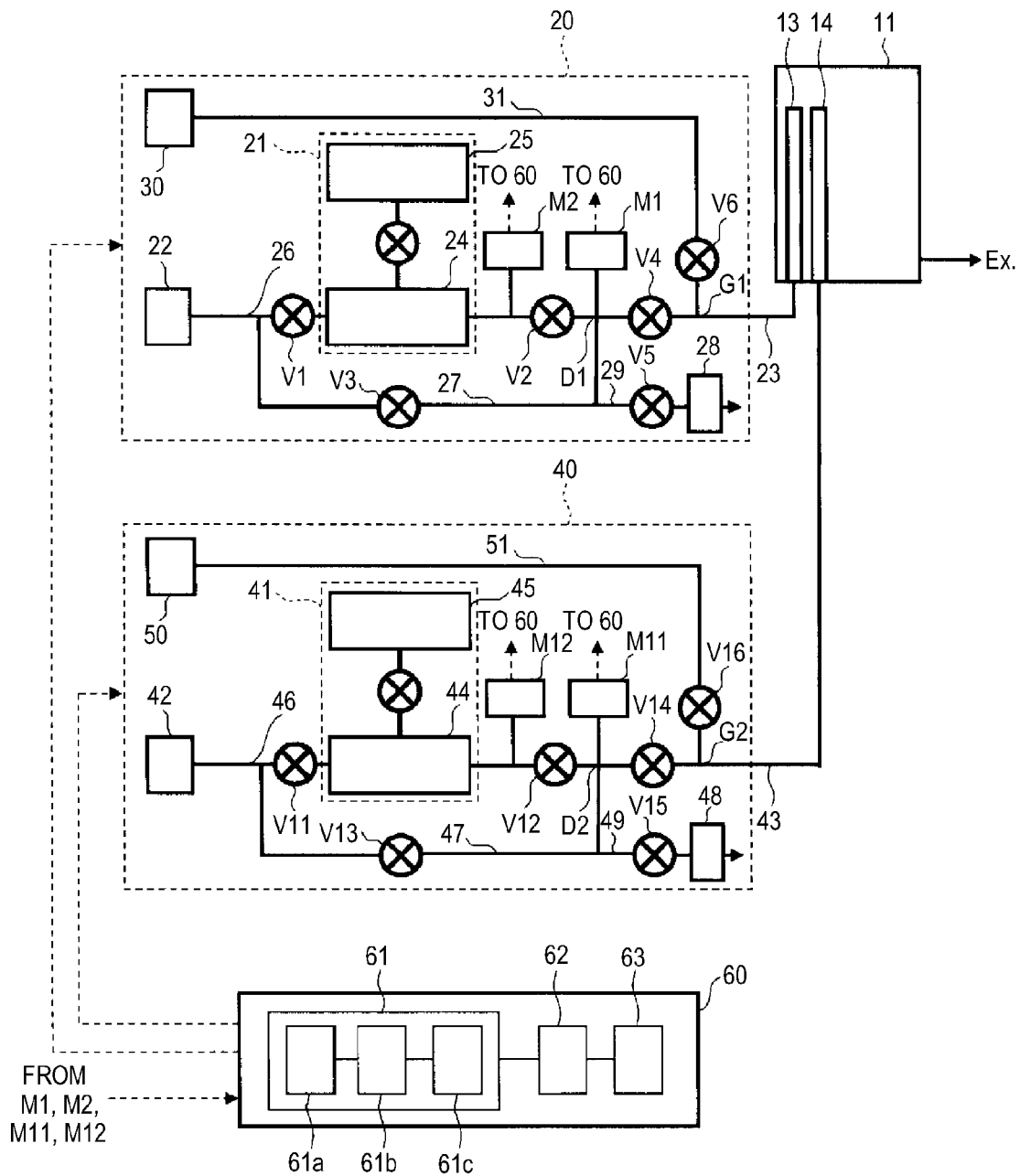
FIG. 17 is a view showing the configuration of raw material gas supply units and a controller in a film forming apparatus according to a first modification of the present embodiment.

FIG. 17 is a view showing the configuration of the raw material gas supply units 20 and 40 and the controller 60 in the film forming apparatus according to this modification.

In this modification, the fifth manometer M3 is not installed in the first raw material gas supply unit 20. However, as shown in FIG. 17, the first manometer M1 is installed at the first supply flow path 23 and chamber 11 side of the valve V2, and the third manometer M2 is installed at the first vaporizer 21 side of the valve V2. And, since the first supply flow path 23 is tightened by the valve V2, there is a pressure difference between both sides of the valve V2, namely, between the pressure P1 measured by the first manometer M1 and the pressure P2 measured by the third manometer M2 in the first supply flow path 23. Thus, conductance and a flow rate of the first supply flow path 23 can be calculated based on the pressure P1 measured by the first manometer M1 and the pressure P2 measured by the third manometer M2.

Similarly, in this modification, the sixth manometer M13 is not installed in the second raw material gas supply unit 40. However, as shown in FIG. 17, the second manometer M11 is installed at the second supply flow path 43 and chamber 11 side of the valve V12, and the fourth manometer M12 is installed at the second vaporizer 41 side of the valve V12. Also, since the second supply flow path 43 is tightened by the valve V12, there is a pressure difference between both sides of the valve V12, namely, between the pressure P11 measured by the second manometer M11 and the pressure P12 measured by the fourth manometer M12 in the second supply flow path 43. Thus, conductance and a flow rate of the second supply flow path 43 can be calculated based on the pressure P11 measured by the second manometer M11 and the pressure P12 measured by the fourth manometer M12.

A film forming method according to this modification may be performed in the same manner as that of the film forming method according to the present embodiment, except for step S16.

In this modification, the fifth manometer M3 is not installed in the first raw material gas supply unit 20. However, in step S16, it can be detected whether or not the vaporization volume of the PMDA gas is within a certain range and whether or not the conductance of the first supply flow path 23 is within a certain range based on the pressure P1 measured by the first manometer M1 and the pressure P2 measured by the third manometer M2. Also, the sixth manometer M13 is not installed in the second raw material gas supply unit 40. However, in step S16, it can be detected whether or not the vaporization volume of the ODA gas is within a certain range and whether or not the conductance of the second supply flow path 43 is within a certain range based on the pressure P11 measured by the second manometer M11 and the pressure P12 measured by the fourth manometer M12.

Here, whether or not the vaporization volume of each raw material gas and the conductance of each supply flow path are within a certain range may be detected by detecting whether or not each pressure is within a certain range by comparing the pressure measured by each manometer with the previously prepared reference data. And, when each pressure is not within the certain range, an alarm may be generated by the alarm generation unit 61c. Also, in step S16, although an alarm is generated, the film formation process may not be stopped, the generation of the alarm may be recorded, the film formation process at that time may be performed to a finish, and then, a maintenance operation may be performed.

Also, in this modification, a polyimide film formed by polymerizing the raw material gas can be continuously stably formed by preventing a change in the supply amount of the raw material gas.

Second Modification of Embodiment

A film forming apparatus according to a second modification of the embodiment of the present disclosure will now be described with reference to FIG. 18.

A film forming apparatus according to this modification is different from the film forming apparatus according to the present embodiment, in that the manometers M2, M3, M12, and M13 are not installed. Other parts are the same as those of the film forming apparatus according to the present embodiment, so a description thereof will be omitted.

Figure 18:
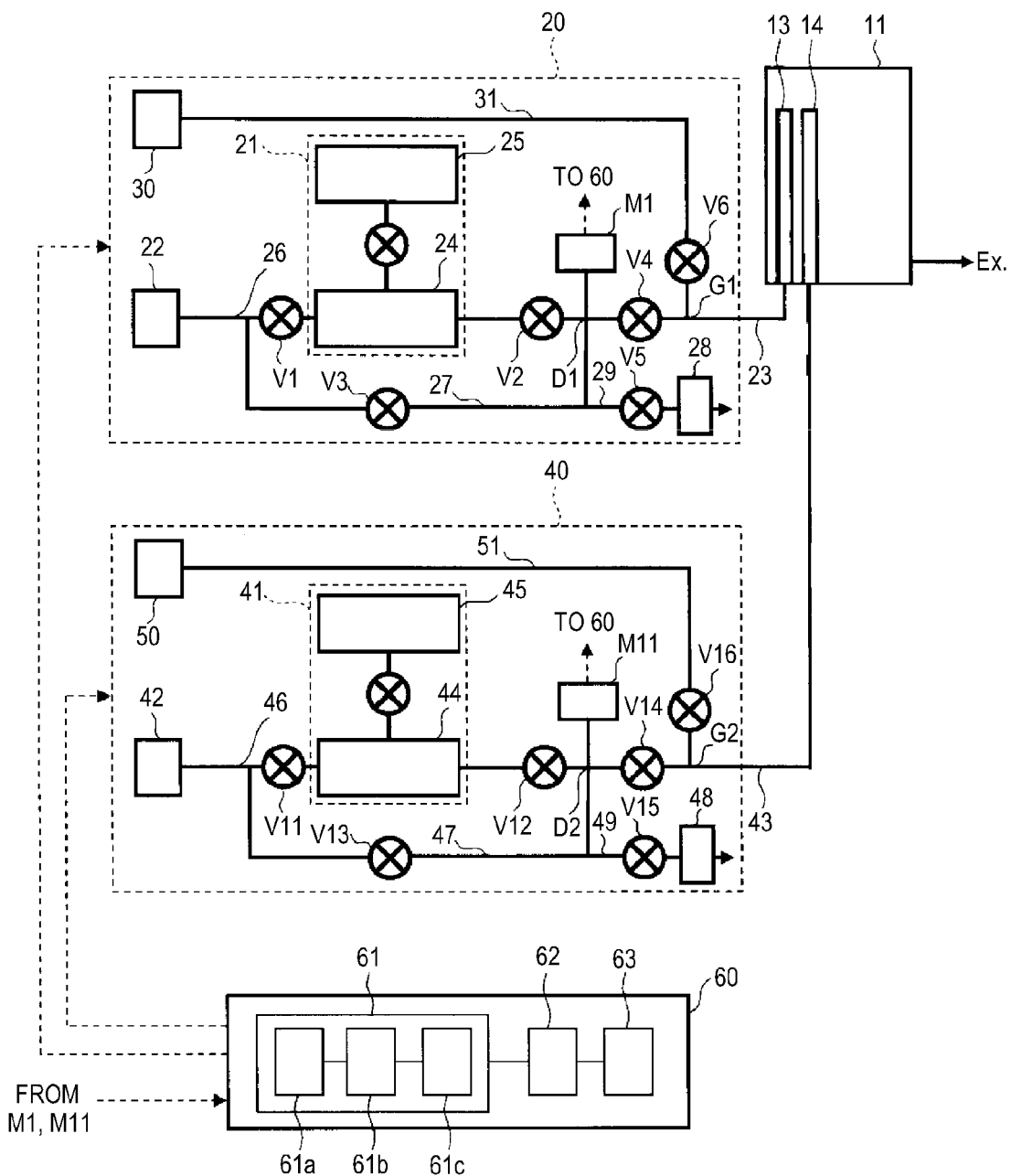
FIG. 18 is a view showing the configuration of raw material gas supply units and a controller in a film forming apparatus according to a second modification of the present embodiment.

FIG. 18 is a view showing the configuration of the raw material gas supply units 20 and 40 and the controller 60 in the film forming apparatus according to this modification.

In this modification, the manometers M2 and M3 are not installed in the first raw material gas supply unit 20. However, as shown in FIG. 18, the first manometer M1 is installed at the first supply flow path 23 and chamber 11 side of the valve V2. And, a supply amount of the first raw material gas is dependent upon the pressure P1 measured by the first manometer M1. Thus, a supply amount of the first raw material gas can be calculated based on the pressure P1 measured by the first manometer M1.

Similarly, in this modification, the manometers M12 and M13 are not installed in the second raw material gas supply unit 20. However, as shown in FIG. 18, the second manometer M11 is installed at the second supply flow path 43 and chamber 11 side of the valve V12. And, a supply amount of the second raw material gas is dependent upon the pressure P11 measured by the second manometer M11. Thus, a supply amount of the second raw material gas can be calculated based on the pressure P11 measured by the second manometer M11.

A film forming method according to this modification may also be performed in the same manner as that of the film forming method according to the present embodiment, except for step S16.

In this modification, the manometers M2 and M3 are not installed in the first raw material gas supply unit 20. However, in step S16, it can be detected whether or not the vaporization volume of the PMDA gas is within a certain range based on the pressure P1 measured by the first manometer M1. Also, the manometers M12 and M13 are not installed in the second raw material gas supply unit 40. However, in step S16, it can be detected whether or not the vaporization volume of the ODA gas is within a certain range based on the pressure P11 measured by the second manometer M11.

Here, whether or not the vaporization volume of each raw material gas is within a certain range may be detected by detecting whether or not each pressure is within a certain range by comparing the pressure measured by each manometer with the previously prepared reference data. And, when each pressure is not within the certain range, an alarm may be generated by the alarm generation unit 61c. Also, in step S16, although an alarm is generated, the film formation process may not be stopped, the generation of the alarm may be recorded, the film formation process at that time may be performed to a finish, and then, a maintenance operation may be performed.

Also, in this modification, a polyimide film formed by polymerizing the raw material gas can be continuously stably formed by preventing a change in the supply amount of the raw material gas.

According to the present disclosure in some embodiments, it is possible to continuously stably form a polyimide film by polymerizing the raw material gas by preventing a change in the supply amount of the raw material gas.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus for forming a polyimide film on a substrate installed within a film forming container by supplying a first raw material gas obtained by vaporizing a first raw material comprised of an aromatic acid dianhydride and a second raw material gas obtained by vaporizing a second raw material comprised of an aromatic diamine to the substrate, the apparatus comprising:

a first vaporizer installed such that an internal pressure thereof can be adjustable, and configured to vaporize the first raw material in a solid state, and supply the vaporized first raw material gas to the substrate;

a second vaporizer installed such that an internal pressure thereof can be adjustable, and configured to vaporize the second raw material in a liquid state, and supply the vaporized second raw material gas to the substrate;

a first pressure measurement unit including a first manometer installed in a first supply flow path along which the first raw material gas flows from the first vaporizer to the film forming container;

a second pressure measurement unit including a second manometer installed in a second supply flow path along which the second raw material gas flows from the second vaporizer to the film forming container;

a controller configured to calculate a supply amount of the first raw material gas based on first data measured by the first pressure measurement unit, calculating a supply amount of the second raw material gas based on second data measured by the second pressure measurement unit, and control the first and second vaporizers such that the calculated supply amount of the first raw material gas and the calculated supply amount of the second raw material gas are uniform, respectively, a first carrier gas supply unit connected to the first vaporizer through a third supply flow path and configured to supply a first carrier gas carrying the first raw material gas to the first vaporizer; and a second carrier gas supply unit connected to the second vaporizer through a fourth supply flow path and configured to supply a second carrier gas carrying the second raw material gas to the second vaporizer, wherein the first carrier gas supply unit and the film forming container are connected through a first bypass flow path detouring the first vaporizer and the first manometer is installed at a position at which the pressure of the first bypass flow path detouring the first vaporizer is measurable, and the second carrier gas supply unit and the film forming container are connected through a second bypass flow path detouring the second vaporizer and the second manometer is installed at a position at which the pressure of the second bypass flow path detouring the second vaporizer is measurable.

2. The apparatus of claim 1, wherein the controller detects whether or not the supply amount of the first raw material gas is within a predetermined first range by comparing the measured first data with previously prepared first reference data, and detects whether or not the supply amount of the second raw material gas is within a predetermined second range by comparing the measured second data with previously prepared second reference data.

3. The apparatus of claim 1, wherein the first pressure measurement unit includes a third manometer installed in the first supply flow path between the first vaporizer and the first manometer, and a first tightening unit configured to tighten the first supply flow path between the first manometer and the third manometer,
the second pressure measurement unit includes a fourth manometer installed in the second supply flow path between the second vaporizer and the second manometer, and a second tightening unit configured to tighten the second supply flow path between the second manometer and the fourth manometer, and
the controller calculates the supply amount of the first raw material gas based on the pressure measured by the third manometer and the pressure measured by the first manometer, and calculates the supply amount of the second raw material gas based on the pressure measured by the fourth manometer and the pressure measured by the second manometer.

4. The apparatus of claim 3, wherein the controller calculates conductance of the first vaporizer based on the pressure measured by the third manometer or the pressure measured by the first manometer, and calculates conductance of the second vaporizer based on the pressure measured by the fourth manometer or the pressure measured by the second manometer.

5. The apparatus of claim 3, wherein the first pressure measurement unit comprises a fifth manometer installed in the third supply flow path,
the second pressure measurement unit includes a sixth manometer installed in the fourth supply flow path, and
the controller calculates conductance of the first vaporizer based on the pressure measured by the fifth manometer, and calculates conductance of the second vaporizer based on the pressure measured by the sixth manometer.

6. The apparatus of claim 1, further comprising:
a first discharge unit connected to the first carrier gas supply unit such that it is switchably connected to the film forming container through the first vaporizer and also through the first bypass flow path, and configured to discharge a gas, and
wherein the first manometer is installed at a position at which it can measure the pressure of a gas flowing from the first vaporizer when the first carrier gas supply unit and the first discharge unit are connected through the first vaporizer to measure the pressure of the first bypass flow path when the first carrier gas supply unit and the first discharge unit are connected through the first bypass flow path, and
the controller calculates a supply amount of the first raw material gas based on the pressure measured by the first manometer when the first carrier gas is being discharged by the first discharge unit through the first vaporizer from the first carrier gas supply unit and the pressure measured by the first manometer when the first carrier gas is being discharged by the first discharge unit through the first bypass flow path from the first carrier gas supply unit.

7. The apparatus of claim 1, further comprising:
an adjustment gas supply unit connected to join the first supply flow path and configured to supply a flow rate adjustment gas for adjusting a flow rate of the carrier gas carrying the first raw material gas.

8. The apparatus of claim 1, wherein the first vaporizer comprises:
a first heating unit configured to heat the first raw material to vaporize the first raw material; and
a first supply unit installed at an upper side of the first heating unit and configured to drop the first raw material to supply the first raw material to the first heating unit.

9. The apparatus of claim 1, wherein the second vaporizer comprises:
a second heating unit configured to heat the second raw material to vaporize the second raw material; and
a second supply unit installed at an upper side of the second heating unit and configured to drop the second raw material to supply the second raw material to the second heating unit.

10. The apparatus of claim 1, wherein the aromatic acid dianhydride is pyromellitic dianhydride, and the aromatic diamine is 4,4'-diaminodiphenylether.

* * * * *